US012770697B2

(12) United States Patent
Zhu

(10) Patent No.: US 12,770,697 B2
(45) Date of Patent: Oct. 20, 2026

(54) OPERATION METHOD FOR MEMORY, MEMORY, MEMORY SYSTEM AND ELECTRONIC SYSTEM FOR MULTI-STAGE PROGRAM VERIFICATION

(71) Applicant: Yangtze Memory Technologies Co., Ltd., Wuhan (CN)

(72) Inventor: Zhijiu Zhu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 327 days.

(21) Appl. No.: 18/395,336

(22) Filed: Dec. 22, 2023

(65) Prior Publication Data

US 2025/0014656 A1 Jan. 9, 2025

(30) Foreign Application Priority Data

Jul. 5, 2023 (CN) ........................ 202310823732.X

(51) Int. Cl.
*G11C 16/34* (2006.01)
*G11C 16/20* (2006.01)
*G11C 16/26* (2006.01)

(52) U.S. Cl.
CPC .......... *G11C 16/3459* (2013.01); *G11C 16/20* (2013.01); *G11C 16/26* (2013.01)

(58) Field of Classification Search
None
See application file for complete search history.

(56) References Cited

U.S. PATENT DOCUMENTS 6,078,519 A 6/2000 Kanamitsu et al.
2021/0391020 A1 12/2021 Choi
2023/0154546 A1 5/2023 Choi
2023/0168820 A1* 6/2023 Wan ....................... G11C 16/26 711/103

FOREIGN PATENT DOCUMENTS

CN 114822662 A 7/2022
JP 2016-073403 A 5/2016

OTHER PUBLICATIONS

Notice of Allowance in Chinese Appln. No. 202310823732.X, mailed on Aug. 29, 2025, 5 pages (with Machine translation).

* cited by examiner

*Primary Examiner* — Alfredo Bermudez Lozada
(74) *Attorney, Agent, or Firm* — Fish & Richardson P.C.

(57) ABSTRACT

An example memory includes a page buffer, and the page buffer includes a first sensing circuit coupled to the sensing node and a dynamic storage circuit coupled to the first sensing circuit. An example memory cell included in the memory is configured to store one of programmed states. An example operation method includes: storing first verification information into the first sensing circuit based on a first potential of the sensing node; transmitting initial verification information in the dynamic storage circuit to the sensing node; transmitting the first verification information from the first sensing circuit to the dynamic storage circuit; performing a clearing operation on the first sensing circuit; and storing second verification information or the initial verification information into the first sensing circuit based on a second potential of the sensing node.

21 Claims, 15 Drawing Sheets

| PB OP | DS | DL | DM | SO |
|---|---|---|---|---|
| DL=1<br>DM=1 | / | 1 | 1 | / |
| DS=DM & P* | Pn<br>+~4BL | 3BL | 4BL | 1 |
| DL=DL & ~ SO | Pn<br>+~4BL | 3BL | 4BL | sensing |
| SO=SO \| ~ DM | Pn<br>+~4BL | 3BL | 4BL | sensing+4B<br>L |
| DM=DL<br>DL=1 | Pn<br>+~4BL | 1 | 3BL | sensing+4B<br>L |
| DL=~SO | Pn<br>+~4BL | 4BL | 3BL | sensing+4B<br>L |
| DS=~SO | Pn pass | 4BL | 3BL | sensing |
| D* =~DS&P* | Pn pass | 4BL | 3BL | / |

OPERATION METHOD FOR MEMORY, MEMORY, MEMORY SYSTEM AND ELECTRONIC SYSTEM FOR MULTI-STAGE PROGRAM VERIFICATION

CROSS-REFERENCE TO RELATED APPLICATIONS

This application claims priority to Chinese Patent Application No. 202310823732.X, filed on Jul. 5, 2023, the disclosure of which is hereby incorporated by reference in its entirety.

TECHNICAL FIELD

The present application relates to the field of memory technologies, and in particular, to an operation method of a memory, a memory, a memory system, and an electronic system.

BACKGROUND

At present, three-dimensional NAND flash memories are usually programmed by means of Incremental Step Pulse Programming (ISPP). In an example, memory cells of the memory are programmed using a plurality of gradually increasing pulse programming voltages in sequence, and each programming process may include a program operation and a verify operation. The verify operation is performed after the program operation. That is, the memory cells are verified using the verify voltage after each program operation is performed on the memory cells.

SUMMARY

Implementations of the present application provide an operation method of a memory, a memory, a memory system, and an electronic system.

In a first aspect, an implementation of the present application provides an operation method of a memory, the memory includes a page buffer, and the page buffer includes a first sensing circuit coupled to a sensing node and a dynamic storage circuit coupled to the first sensing circuit; a memory cell included in the memory is configured to store one of a plurality of programmed states; and the operation method includes:

- storing first verification information into the first sensing circuit based on a first potential of the sensing node;
- transmitting initial verification information in the dynamic storage circuit to the sensing node, the initial verification information including verification information corresponding to a verified programmed state among the plurality of programmed states;
- transmitting the first verification information from the first sensing circuit to the dynamic storage circuit, and performing a clearing operation on the first sensing circuit; and
- storing second verification information or the initial verification information into the first sensing circuit based on a second potential of the sensing node;
- wherein the first potential of the sensing node corresponding to the first verification information is greater than the second potential of the sensing node corresponding to the second verification information.

In a second aspect, an implementation of the present application further provides an operation method of a memory, wherein the memory includes a page buffer, and the page buffer includes a first sensing circuit coupled to a sensing node and a dynamic storage circuit coupled to the first sensing circuit; a memory cell included in the memory is configured to store one of a plurality of programmed states; and the operation method includes:

- latching first verification information into the first sensing circuit during a first sensing stage of a verify operation of the memory;
- transmitting initial verification information in the dynamic storage circuit to the sensing node, the initial verification information including verification information corresponding to a verified programmed state among the plurality of programmed states included in the memory;
- enabling a transmission channel between the first sensing circuit and the dynamic storage circuit, transmitting the first verification information to the dynamic storage circuit, and performing a clearing operation on the first sensing circuit; and
- latching second verification information into the first sensing circuit during a second sensing stage of the verify operation;
- wherein the first potential of the sensing node corresponding to the first verification information is greater than the second potential of the sensing node corresponding to the second verification information.

In a third aspect, the implementation of the present application provides a memory, including:

- a memory array, memory cells included in the memory array being configured to store one of a plurality of programmed states;
- a plurality of page buffers coupled to the memory array, each page buffer including a first sensing circuit coupled to a sensing node and a dynamic storage circuit coupled to the first sensing circuit; and
- a control logic circuit coupled to the memory array and the plurality of page buffers; wherein,
- the control logic circuit is configured to: store first verification information into the first sensing circuit based on a first potential of the sensing node; transmit initial verification information in the dynamic storage circuit to the sensing node, the initial verification information including verification information corresponding to a verified programmed state among the plurality of programmed states; transmit the first verification information from the first sensing circuit to the dynamic storage circuit, and performing a clearing operation on the first sensing circuit; and store second verification information or the initial verification information into the first sensing circuit based on a second potential of the sensing node; wherein the first potential of the sensing node corresponding to the first verification information is greater than the second potential of the sensing node corresponding to the second verification information.

In a fourth aspect, the implementation of the present application further provides a memory system, including: one or more memories as described above and a memory controller coupled to the memories and configured to control the memories.

In a fifth aspect, the implementation of the present application further provides an electronic system, including: the memory system as described above and a host coupled to the memory system.

Implementations of the present application provide an operation method of a memory, a memory, a memory system, and electronic system. The memory includes a page buffer, and the page buffer includes a first sensing circuit coupled to a sensing node and a dynamic storage circuit coupled to the first sensing circuit. The memory cell included in the memory is configured to store one of a plurality of programmed states. The operation method includes: storing first verification information into the first sensing circuit based on a first potential of the sensing node; transmitting initial verification information in the dynamic storage circuit to the sensing node, the initial verification information including verification information corresponding to a verified programmed state among the plurality of programmed states; transmitting the first verification information from the first sensing circuit to the dynamic storage circuit, and performing a clearing operation on the first sensing circuit; and storing second verification information or the initial verification information into the first sensing circuit based on a second potential of the sensing node; wherein the first potential of the sensing node corresponding to the first verification information is greater than the second potential of the sensing node corresponding to the second verification information. The operation method provided by the implementation of the present application transmits the initial verification information in the dynamic storage circuit to the sensing node, and transmits the first verification information from the first sensing circuit to the dynamic storage circuit, and performs a clearing operation on the first sensing circuit, so that the first sensing circuit can sense the first verification information and the second verification information at different time. In this way, the program verify operation of the 4BL (bit line) scheme of the memory cell of the memory can be completed only by one complete sensing at the same verify voltage.

BRIEF DESCRIPTION OF THE DRAWINGS

In the drawings, which are not necessarily to scale, like reference numerals may describe similar components in the different views. The same number with a different letter suffix may indicate different instances of a similar component. The drawings generally illustrate various implementations discussed in this document, by way of example and not limitation.

DETAILED DESCRIPTION

Figure 1:
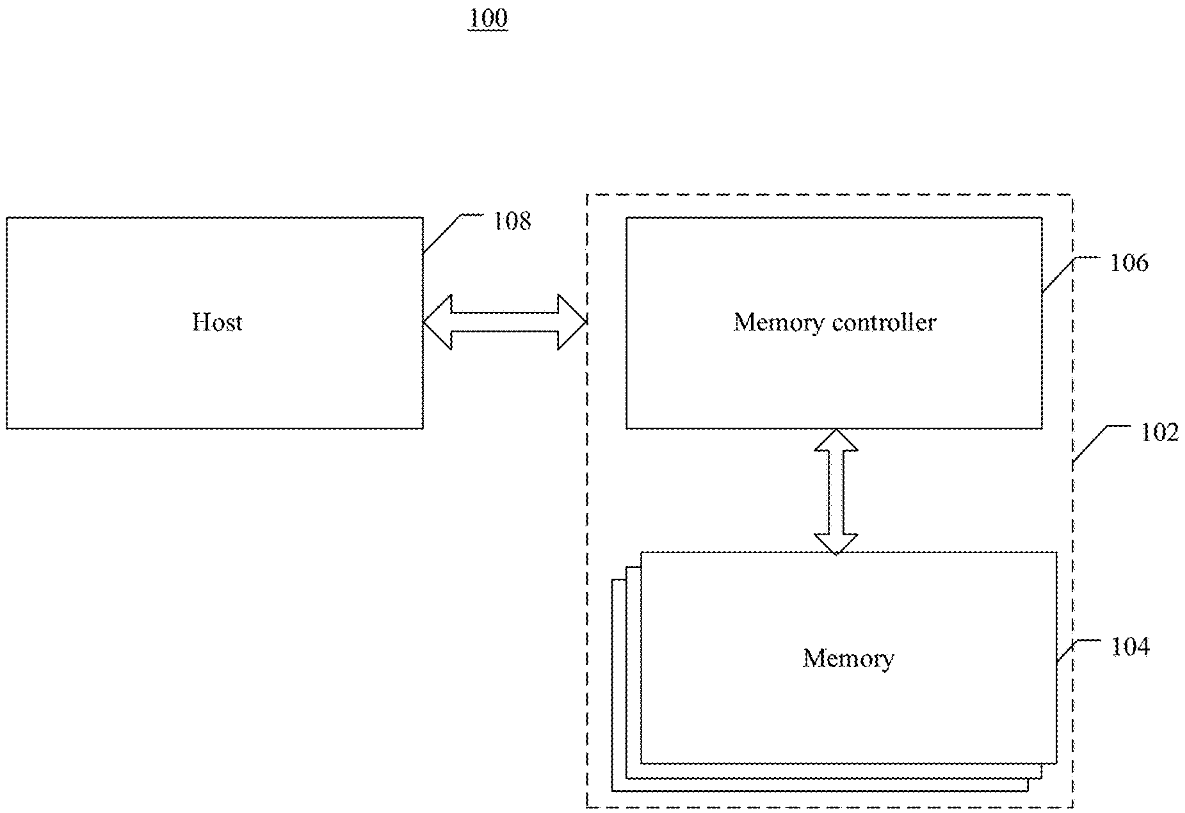
FIG. 1 is an exemplary system block diagram of an electronic device having a memory system in accordance with some aspects of the present application.

Various implementations of the present application are described in more detail below with reference to the accompanying drawings. Other implementations that are variations of any disclosed implementation can be formed by differently configuring or arranging elements and features of the implementations of the present application. Therefore, the implementations of the present application are not limited to the implementations set forth herein. Rather, the described implementations are provided so that the implementations of the present application will be thorough and complete, and will fully convey the scope of the implementations of the present application to those skilled in the art to which the implementations of the present application pertain. It should be noted that references to "an implementation," "another implementation," and the like do not necessarily mean only one implementation, and that different references to any such phrase are not necessarily relate to the same implementation. It should be understood that although the terms such as "first," "second," "third," and the like may be used herein to identify various elements, these elements should not be limited by these terms. These terms are used to distinguish one element from another element having the same or similar name. Therefore, a first element in one implementation may also be referred to as a second or third element in another implementation without departing from the spirit and scope of the implementations of the present application.

The drawings are not necessarily to scale, and in some instances, the scale may have been enlarged to clearly illustrate features of the implementations. When an element is referred to as being connected or coupled to another element, it should be understood that the former may be directly connected or coupled to the latter or electrically connected or coupled to the latter via one or more intervening elements therebetween. In addition, it will also be understood that when an element is referred to as being "between" two elements, it can be the only element between the two elements, or one or more intervening elements may also be present.

The terminology used herein is for the purpose of describing particular implementations only and is not intended to be limiting of the application. As used herein, singular forms are intended to include plural forms unless the context clearly dictates otherwise. Unless otherwise stated or clearly understood as a singular form from the context, the articles "a" and/or "an" used in the implementations of the present application and the appended claims shall collectively be interpreted as meaning "one or more". It should be further understood that the terms "comprise", "comprising", "include" and "including" used in the implementations of the present application specify the presence of the stated elements and do not exclude the presence or addition of one or more other elements. The term "and/or" used in the implementations of the present application includes any and all combinations of one or more associated listed items. Unless otherwise defined, all terms including technical and scientific techniques used in the implementations of the present application have the same meanings as commonly understood by those of ordinary skill in the art to which the present application belongs in view of the implementations of the present application. It should be further understood that, unless clearly defined in the implementations of the present application, terms such as those defined in commonly used dictionaries should be interpreted as having meanings consistent with their meanings in the context of the implementations of the present application and related art, and should not be interpreted in an idealized or overly formal manner.

In the following description, numerous specific details are set forth in order to provide a thorough understanding of the application, and the application may be practiced without some or all of these specific details. In other instances, well known processing structures and/or processing have not been described in detail so as not to unnecessarily obscure the application. It should also be understood that in some cases, unless specifically stated otherwise, features or elements described with respect to one implementation may be used alone or in combination with other features or elements of another implementation as would be obvious to one skilled in the relevant art. Hereinafter, various implementations of the present application are described in detail with reference to the accompanying drawings. The following description focuses on details to facilitate understanding of the implementations of the application. Well-known technical details may be omitted so as not to obscure the features and aspects of the implementations of the application.

Implementations of the present application relates to an operation method of a memory, which enables the program verify operation of the 4BL scheme of the memory cells of the memory by performing only one complete sensing at the same verify voltage.

The implementations of the present application will be further described in detail below in conjunction with the accompanying drawings and specific implementations.

FIG. 1 illustrates a block diagram of an example system with a memory in accordance with some aspects of the present application. In FIG. 1, system 100 may be a mobile phone, desktop computer, laptop computer, tablet computer, vehicle computer, game console, printer, pointing device, wearable electronic device, smart sensor, Virtual Reality (VR) device, Augmented Reality (AR) device, or any other suitable electronic devices having storage. As shown in FIG. 1, the system 100 may include a host 108 and a memory system 102. The memory system 102 has one or more memories 104 and a memory controller 106. The host 108 may be a processor of an electronic device, such as a Central Processing Unit (CPU) or a System of Chip (SoC), where the SoC may be, for example, an Application Processor (AP). The host 108 may be configured to send data to or receive data from the memory 104. In an example, the memory 104 may be any memory disclosed in this application, for example, Phase Change Random Access Memory (PCRAM), three-dimensional NAND flash memory, and so on.

According to some implementations, the memory controller 106 is coupled to the memory 104 and the host 108, and is configured to control the memory 104. The memory controller 106 may manage data stored in the memory 104 and communicate with the host 108. In some implementations, the memory controller 106 is designed to operate in a low duty-cycle environment, such as a Secure Digital (SD) card, a Compact Flash (CF) card, a Universal Serial Bus (USB) flash drive, or other media used in an electronic device such as a personal computer, digital camera, mobile phone, etc., in a low duty cycle environment. In some implementations, the memory controller 106 is designed to operate in a high duty-cycle environment, such as a Solid State Drive (SSD) or an embedded Multi Media Card (eMMC), where the SSD or eMMC is used as enterprise memory arrays and data storage for mobile devices in high duty cycle environments such as smartphones, tablet computers, laptops, etc. The memory controller 106 may be configured to control operations of the memory 104, such as read, erase and program operations. The memory controller 106 may be further configured to manage various functions related to data stored or to be stored in the memory 104, including but not limited to bad block management, garbage collection, logical-to-physical address translation, wear leveling, and the like. In some implementations, the memory controller 106 is further configured to process an Error Correction Code (ECC) on data read from or written to the memory 104. The memory controller 106 may also perform any other suitable functions, such as formatting memory 104. The memory controller 106 may communicate with external devices (e.g., host 108) according to a particular communication protocol. For example, the memory controller 106 can communicate with external devices via at least one of various interface protocols, such as USB protocol, MMC protocol, Peripheral Component Interconnection (PCI) protocol, PCI Express (PCI-E) protocol, Advanced Technology Attachment (ATA) protocol, Serial ATA protocol, Parallel ATA protocol, Small Computer Small Interface (SCSI) protocol, Enhanced Small Disk Interface (ESDI) protocol, Integrated Drive Electronics (IDE) protocol, Firewire protocol, etc.

Figure 2:
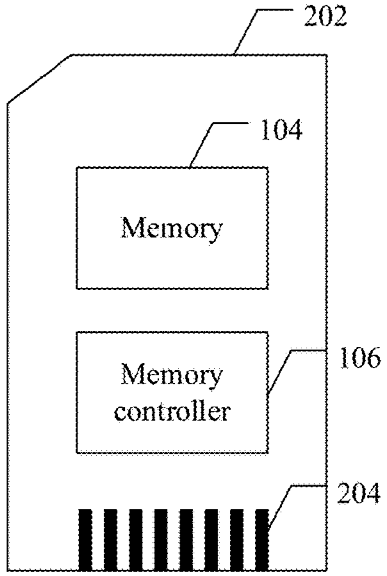
FIG. 2 is a schematic diagram of an exemplary memory card having a memory in accordance with some aspects of the present application.
Figure 3:
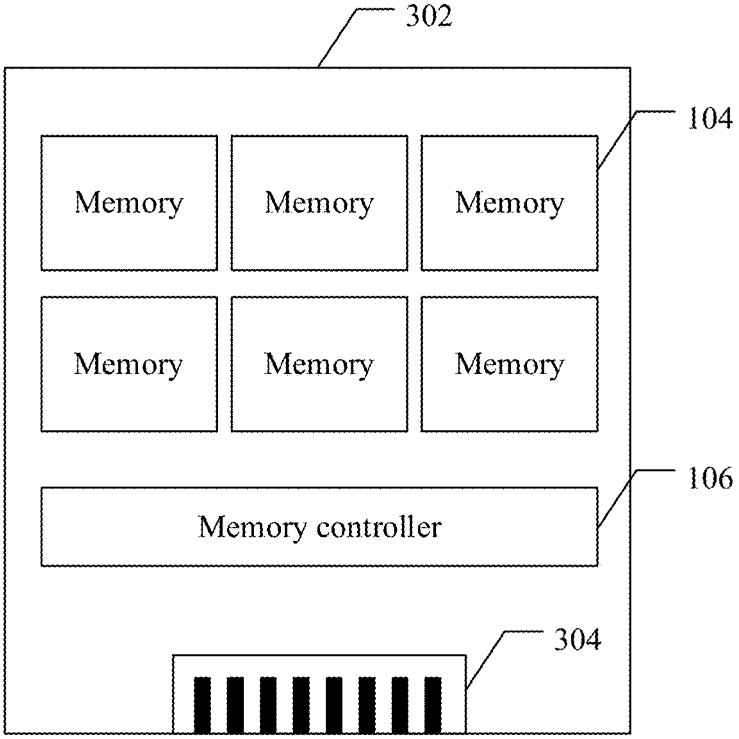
FIG. 3 is a schematic diagram of an exemplary SSD with a memory in accordance with some aspects of the present application.

The memory controller 106 and one or more memories 104 may be integrated into various types of storage devices, e.g., included in the same package (e.g., Universal Flash Storage (UFS) package or eMMC package). That is, the memory system 102 can be implemented and packaged into different types of end electronic products. In one example as shown in FIG. 2, the memory controller 106 and a single memory 104 may be integrated into a memory card 202. Memory cards may include PC cards (Personal Computer Memory Card International Association, PCMCIA), CF cards, Smart Media (SM) cards, memory sticks, multimedia cards (MMC, RS-MMC, and MMCmicro), SD cards (SD, miniSD, microSD, and SDHC), UFS, etc. The memory card may further include a memory card connector 204 that couples the memory card with a host (e.g., the host 108 in FIG. 1). In another example as shown in FIG. 3, the memory controller 106 and multiple memories 104 may be integrated into SSD 302. The SSD may further include an SSD connector 304 that couples the SSD to a host (e.g., the host 108 in FIG. 1). In some implementations, the storage capacity and/or operating speed of the SSD is greater than the storage capacity and/or operating speed of the memory card. In addition, the memory controller 106 can also be configured to control the erase, read, and write operations of the memory 104.

Figure 4:
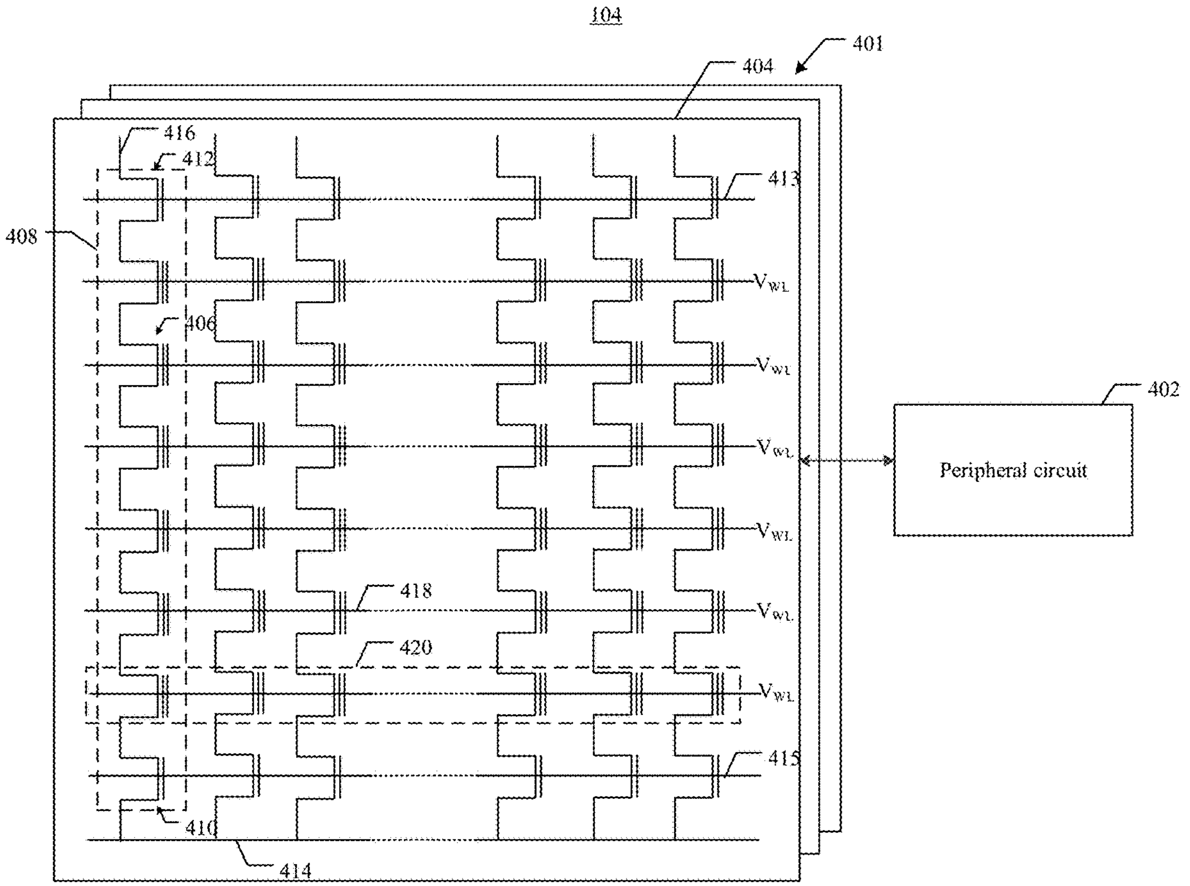
FIG. 4 is a schematic diagram of an exemplary memory including peripheral circuits in accordance with some aspects of the present application.

FIG. 4 is a schematic diagram of an exemplary memory including peripheral circuits. As shown in FIG. 4, the memory 104 may include a memory array 401 and a peripheral circuit 402 coupled to the memory array 401. The memory array 401 may be a NAND flash memory array. The memory cells 406 are provided in the form of an array of NAND memory strings 408, each NAND memory string 408 extending vertically above a substrate (not shown). In some implementations, each NAND memory string 408 includes multiple memory cells 406 coupled in series and stacked vertically. Each memory cell 406 may hold a continuous analog value, such as a voltage or charge, depending on the number of electrons trapped within the storage area of the memory cell 406. Each memory cell 406 may be a floating-gate type memory cell including a floating gate transistor, or a charge-trap type memory cell including a charge trap transistor.

In some implementations, each memory cell 406 is a Single Level Cell (SLC) that has two possible data states and thus can store one bit of data. For example, a first data state "O" may correspond to a first voltage range, and a second data state "1" may correspond to a second voltage range. In some implementations, the first voltage range and the second voltage range may be referred to as threshold voltage distributions of memory cells. In some implementations, each memory unit 406 may be a Multi Level Cell (MLC). For example, MLC may store two bits per cell, three bits per cell (also known as a Trinary Level Cell (TLC)), or four bits per cell (also known as a Quadruple Level Cell (QLC)). The data state of any type of memory cell includes an erased state and (one or more) programmed state. When a program operation is performed on the memory cell, a memory cell in an erased state is programmed into a certain programmed state. Generally speaking, the voltage value in the voltage range corresponding to the programmed state of the memory cell is relatively large.

As shown in FIG. 4, each NAND memory string 408 may include a source select gate (SSG) 410 at its source terminal and a drain select gate (DSG) 412 at its drain terminal. SSG 410 and DSG 412 may be configured to activate selected NAND memory strings 408 (columns of the array) during read and program (or write) operations. In some implementations, the sources of the NAND memory strings 408 in the same block 404 are coupled by the same source line (SL) 414 (e.g., a common SL). In other words, according to some implementations, all NAND memory strings 408 in the same block 404 have an array common source (ACS). According to some implementations, the DSG 412 of each NAND memory string 408 is coupled to a corresponding bit line 416 from which data can be read and written via an output bus (not shown). In some implementations, each NAND memory string 408 is configured be selected or deselected by applying a select voltage (e.g., above the threshold voltage of transistors with DSG 412) or deselect voltage (e.g., 0 volts (V)) to the corresponding DSG 412 via one or more DSG lines 413 and/or a select voltage (e.g., above the threshold voltage of transistors with SSG 410) or deselect voltage (e.g., 0 V) to the corresponding SSG 410 via one or more SSG lines 415.

As shown in FIG. 4, NAND memory string 408 may be organized into a plurality of blocks 404, each of which may have a common source line 414 (e.g., coupled to ground). In some implementations, each block 404 is a basic unit of data with an erase operation. That is, all memory cells 406 on the same block 404 are erased simultaneously. To erase the memory cells 406 in the selected block 404, the source lines 414 coupled to the selected block 404 and the unselected blocks 404 in the same plane as the selected block 404 may be biased with an erase voltage (Vers) (for example, a high positive voltage of 20V or higher). It should be understood that, in some examples, erase operations may be performed at the half-block level, at the quarter-block level, or with any suitable number or fraction of blocks. The memory cells 406 of adjacent NAND memory strings 408 may be coupled by word lines 418 that select which row of memory cells 406 receives read and program operations. In some implementations, the memory cells 406 coupled to the same word line 418 form a page 420.

Figure 5:
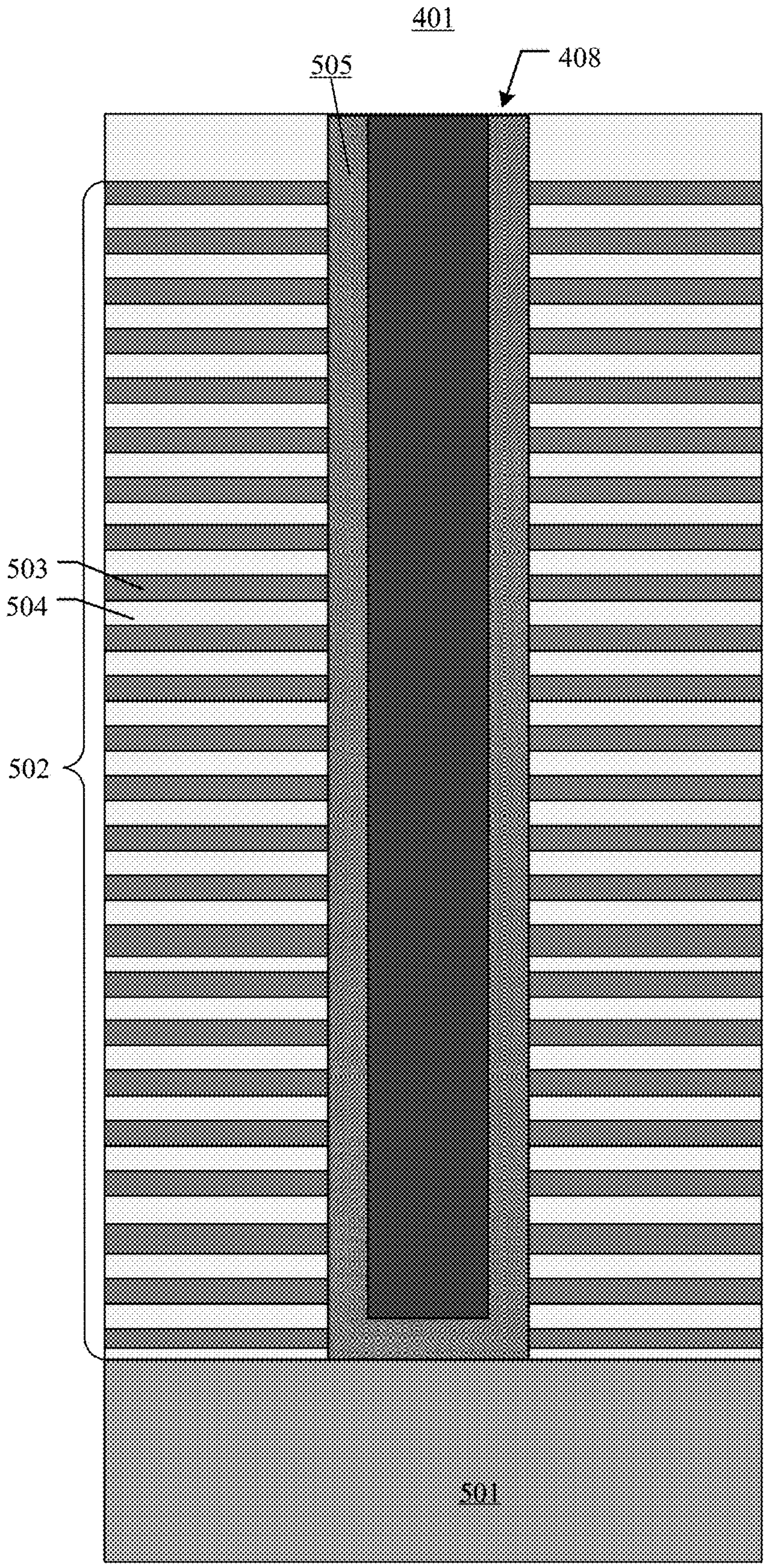
FIG. 5 is a side view of a cross-section of an exemplary memory array 401 including NAND memory strings 408 in accordance with some aspects of the present application.

FIG. 5 illustrates a side view of a cross-section of an exemplary memory array 401 including NAND memory strings 408 in accordance with aspects of the present application. As shown in FIG. 5, NAND memory string 408 may extend vertically above substrate 501 through memory stack layer 502. Substrate 501 may include silicon (e.g., monocrystalline silicon), silicon germanium (SiGe), gallium arsenide (GaAs), germanium (Ge), silicon-on-insulator (SOI), germanium-on-insulator (GOI), or any other suitable materials.

The memory stack layer 502 may include alternating gate conductive layers 503 and gate-to-gate dielectric layers 504. The number of memory cells 406 in the memory array 401 may be determined by the number of gate conductive layer 503 and gate-to-gate dielectric layer 504 pairs in memory stack layer 502. The gate conductive layer 503 may include conductive materials including but not limited to tungsten (W), cobalt (Co), copper (Cu), aluminum (Al), polysilicon, doped silicon, silicide or any combination thereof. In some implementations, each gate conductive layer 503 includes a metal layer, such as a tungsten layer. In some implementations, each gate conductive layer 503 includes a doped polysilicon layer. Each gate conductive layer 503 may include a control gate surrounding the memory cell 406, and may extend laterally at the top of memory stack layer 502 as DSG line 413, at the bottom of memory stack layer 502 as SSG line 415, or between DSG line 413 and SSG line 415 as word line 418.

As shown in FIG. 5, NAND memory string 408 includes a channel structure 505 extending vertically through the memory stack layer 502. In some implementations, the channel structure 505 includes a channel hole filled with (one or more) semiconductor material and (one or more) dielectric material. In some implementations, the semiconductor channel includes silicon, e.g., polysilicon. In some implementations, the memory film is a composite dielectric layer including a tunneling layer, a storage layer (also referred to as a "charge trapping/storage layer"), and a barrier layer. The channel structure 505 may have a cylindrical shape (e.g., a pillar shape). According to some implementations, the semiconductor channel, the tunneling layer, the storage layer and the barrier layer are radially arranged in this order from the center of the pillar toward the outer surface of the pillar. The tunneling layer may include silicon oxide, silicon oxynitride, or any combination thereof. The storage layer may include silicon nitride, silicon oxynitride, or any combination thereof. The barrier layer may include silicon oxide, silicon oxynitride, a high permittivity (high-k) dielectric, or any combination thereof. In one example, the memory film may include a composite layer of silicon oxide/silicon oxynitride/silicon oxide (ONO).

Figure 6:
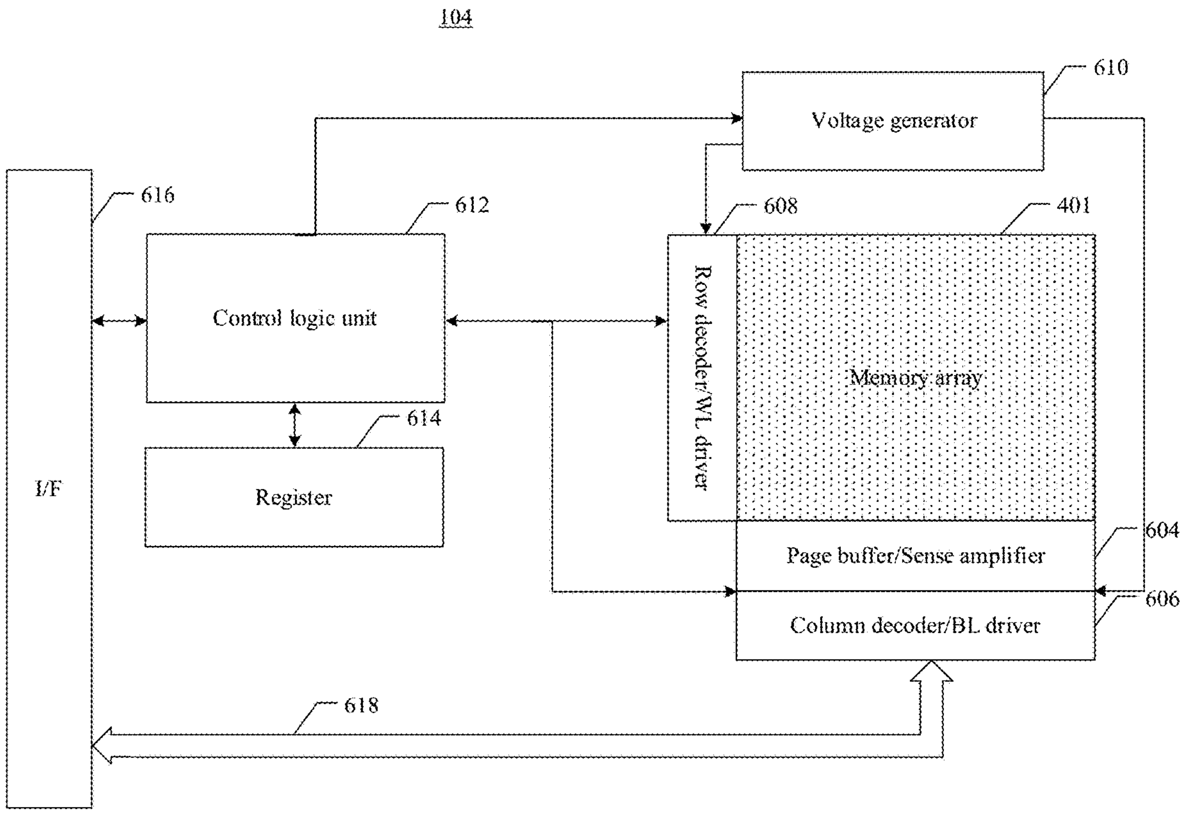
FIG. 6 is a block diagram of an exemplary memory including a memory array and peripheral circuits in accordance with some aspects of the present application.

Referring back to FIG. 4, the peripheral circuit 402 may be coupled to the memory array 401 through bit lines 416, word lines 418, source lines 414, SSG lines 415, and DSG lines 413. The peripheral circuit 402 may include any suitable analog, digital, and mixed-signal circuitry for facilitating operation of the memory array 401 by applying voltage and/or current signals to and sensing voltage and/or current signals from each target memory cell 406 via bit lines 416, word lines 418, source lines 414, SSG lines 415, and DSG lines 413. The peripheral circuit 402 may include various types of peripheral circuits formed using metal-oxide-semiconductor (MOS) technology. For example, FIG. 6 shows some exemplary peripheral circuits. The peripheral circuit 402 includes a page buffer/sense amplifier 604, a column decoder/bit line driver 606, a row decoder/word line driver 608, a voltage generator 610, a control logic unit 612, a register 614, an interface 616, and a data bus 618. It should be understood that in some examples, additional peripheral circuits not shown in FIG. 6 may also be included.

The page buffer/sense amplifier 604 may be configured to read data from and program (write) data to the memory array 401 according to control signals from the control logic unit 612. In one example, the page buffer/sense amplifier 604 may store a page of program data (write data) to be programmed into one page 420 of memory array 401. In another example, the page buffer/sense amplifier 604 may perform a program verify operation to ensure that data has been correctly programmed into the memory cell 406 coupled to selected word line 418. In yet another example, the page buffer/sense amplifier 604 may also sense a low power signal from bit line 416 representing a data bit stored in memory cell 406 and amplify the small voltage swing into a recognizable logic level during a read operation. The column decoder/bit line driver 606 may be configured to be controlled by control logic unit 612 and to select one or more NAND memory strings 408 by applying bit line voltages generated from the voltage generator 610.

The row decoder/word line driver 608 may be configured to be controlled by control logic unit 612, and select/deselect blocks 404 of the memory array 401 and word lines 418 of the blocks 404. The row decoder/wordline driver 608 may also be configured to drive word line 418 using a word line voltage generated from the voltage generator 610. In some implementations, the row decoder/word line driver 608 can also select/deselect and drive the SSG line 415 and the DSG line 413. As described in detail below, the row decoder/word line driver 608 is configured to perform erase operations on the memory cells 406 coupled to (one or more) selected word line 418. The voltage generator 610 may be configured to be controlled by the control logic unit 612, and generate word line voltages (e.g., read voltages, program voltages, pass voltages, local voltages, verify voltages, etc.), bit line voltages, and source line voltages to be supplied to the memory array 401.

The control logic unit 612 may be coupled to each of the peripheral circuits described above and configured to control the operation of each of the peripheral circuits. The register 614 may be coupled to the control logic unit 612 and include status registers, command registers and address registers for storing status information, command operation codes (OP codes) and command addresses for controlling the operation of each peripheral circuit. The interface 616 may be coupled to the control logic unit 612 and act as a control buffer to buffer and relay control commands received from a host (not shown) to the control logic unit 612 and to buffer and relay status information received from the control logic unit 612 to the host. The interface 616 may also be coupled to the column decoder/bit line driver 606 via data bus 618 and act as a data I/O interface and data buffer to buffer and relay data to or from the memory array 401.

Figure 7:
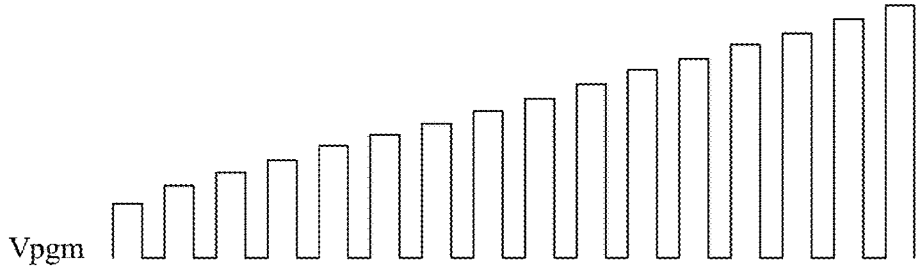
FIG. 7 is a set of exemplary programming voltages for ISPP programming in accordance with some aspects of the present application.
Figure 8:
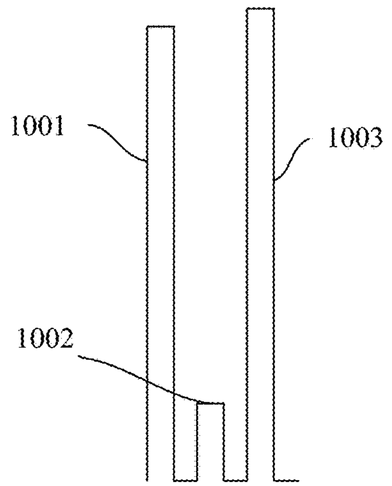
FIG. 8 is an exemplary set of verify voltages for a verify operation in accordance with some aspects of the present application.

Based on the memory and memory system described above, for a memory with multiple programmed states, for example, a 3D NAND flash memory, a program operation and a verify operation are included when the memory cells of this NAND flash memory are programmed. The program operation can adopt the ISPP mode. The ISPP scheme may be to program the selected memory cells several times while the word line bias voltage is gradually increased based on the step voltage, where the incremental step pulse Vpgm is illustrated in FIG. 7. The verify operation may be an operation to know whether the programmed memory cell is programmed to the target programmed state. Generally, the verify operation is performed between applying the programming voltage twice to the word line coupled to the memory cell. That is, the program operation and the verify operation may be performed alternately. When currently at least one memory cell in the same programmed state is to be verified, a corresponding verify voltage is applied to a word line coupled to the at least one memory cell, and whether the memory cell passes verification is verified based on the verify voltage. Considering that memory cells coupled to the same word line may be in different programmed states corresponding to different reference threshold voltages, multiple verification processes are required. That is, the verify operation may include one or a group of verify voltage pulses. The verify voltage pulses are shown in FIG. 8. In FIGS. 8, 1001 and 1003 are step program pulses Vpgm, and 1002 is verify voltage pulse. For each verification, it is usually necessary to precharge the sensing node coupled to the memory cell to a higher potential (for example, the preset initial voltage described later), and then perform at least one discharge operation on the sensing node, so that the voltage at the sensing node (SO) corresponding to the memory cell at different discharge stages is sensed by the sensing circuit, so as to determine whether the verification of the memory cell is completed according to the sensing result. The verification result may be stored in the page buffer to reflect the programming result of the memory cell.

Figure 9:
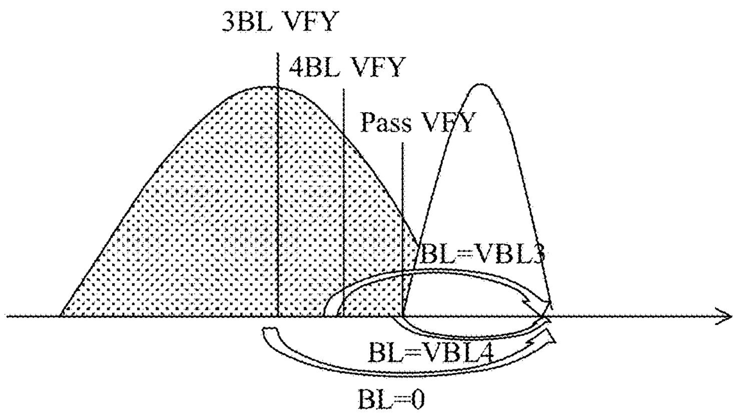
FIG. 9 is a schematic diagram of a 4BL BIAS programming in accordance with some aspects of the present application.

In some implementations, in the programming of 3D NAND flash memory, 4BL BIAS programming is usually adopted for programming in order to improve the programming quality. In an example, the 4BL BIAS programming may refer to controlling the voltages applied to the bit lines of the memory cells to be different through the difference between the programmed state of the memory cells being programmed and their respective target programmed states, so that the voltages on the bit lines of the memory cells currently in different programmed states have a certain difference to program each memory cell more accurately, thereby obtaining a better distribution of the threshold voltage (Vt) of the memory cells. In order to determine the voltages on the bit lines of memory cells in different programmed states, as shown in FIG. 9, three sensings are required in the verify operation of the 4BL BIAS programming, including 3BL sensing, 4BL sensing, and Pass sensing in sequence, to determine whether the threshold voltage of the memory cell being verified reaches 3BL interval, 4BL interval or Pass interval, respectively. It should be noted that the 3BL sensing process corresponds to the 3BL verification (VFY) shown in FIG. 9; the 4BL sensing process corresponds to the 4BL VFY shown in FIG. 9; the Pass sensing process corresponds to the Pass VFY shown in FIG. 9. The 3BL interval may refer to the area on the left side of the 3BL VFY in FIG. 9. The 4BL interval may refer to the overlapping area between the right area of the 3BL VFY and the left side of the 4BL VFY in FIG. 9. The Pass interval may refer to the overlapping area between the right area of the 4BL VFY and the left side of the Pass VFY shown in FIG. 9. When program operation is performed on the memory cells in different intervals again, the bias voltages applied to the bit lines are different to more accurately program the memory cells into the target programmed state. For example, when the program operation is performed on the memory cells in the 3BL interval, 0 volts (V) is applied to their corresponding bit lines. When the program operation is performed on the memory cells in the 4BL interval, a voltage of VBL3 is applied to their corresponding bit lines. When the program operation is performed on the memory cells in the Pass interval, a voltage of VBL4 is applied to their corresponding bit lines.

Figure 10:
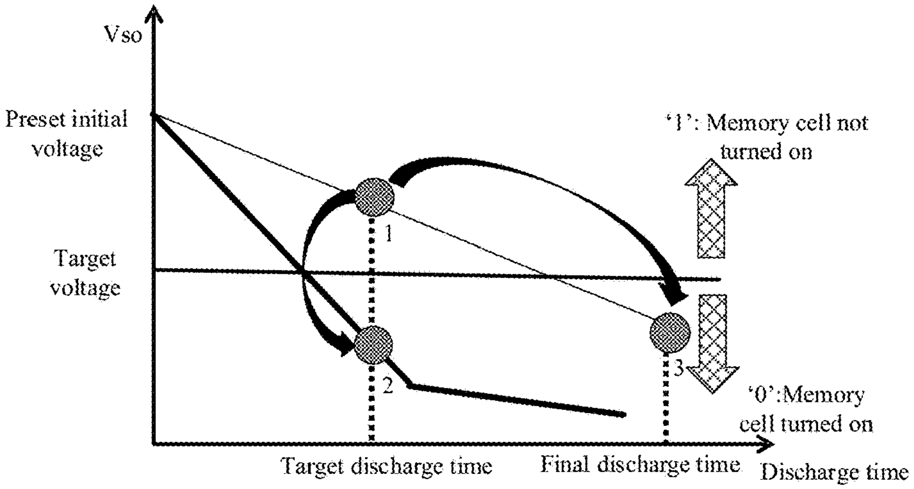
FIG. 10 is a comparison diagram of one sensing and two sensings in accordance with some aspects of the present application.

In some implementations, the verify operation of the 4BL BIAS programming includes: performing 3BL sensing alone, that is, first precharging the sensing node coupled to the memory cell to be verified to a higher voltage (for example, a preset initial voltage), then discharging the sensing node, and after discharging for a period of time, sensing the potential of SO, to determine whether the threshold voltage of the memory cell reaches the 3BL interval. Next, 4BL sensing and Pass sensing may be performed by means of dual-strobe sensing. That is, when the corresponding sensing node is precharged to a higher voltage (for example, the preset initial voltage) at the same time, 4BL sensing and Pass sensing are performed at different time points during the sensing node discharge process, thereby shortening the verification time and improving the performance of the memory. The advantage of adopting dual-strobe sensing for 4BL sensing and Pass sensing is that, as shown in FIG. 10, SO potentials at node 1 and node 3 in one sensing are detected respectively to perform 4BL sensing and Pass sensing respectively. Because it takes a long time to precharge the corresponding SO to the preset initial voltage, 4BL sensing and pass sensing are performed at node 1 and node 3 respectively when precharging the SO once. Because only one precharging process is required, it takes less time as compared to two independent precharges in which 4BL sensing and Pass sensing are performed at node 1 and node 2 respectively. Therefore, the performance of the memory using the dual-strobe sensing verification method is better.

However, the verify operation of the above-mentioned 4BL BIAS programming needs to precharge the sensing node coupled to the memory cell to be verified to a higher voltage twice or three times to complete 3BL sensing, 4BL sensing and Pass sensing. It is not possible to precharge the sensing node only once at the same verify voltage, and then perform sensing at three different time points during the discharge process of the sensing node to complete 3BL sensing, 4BL sensing and Pass sensing.

Figure 11:
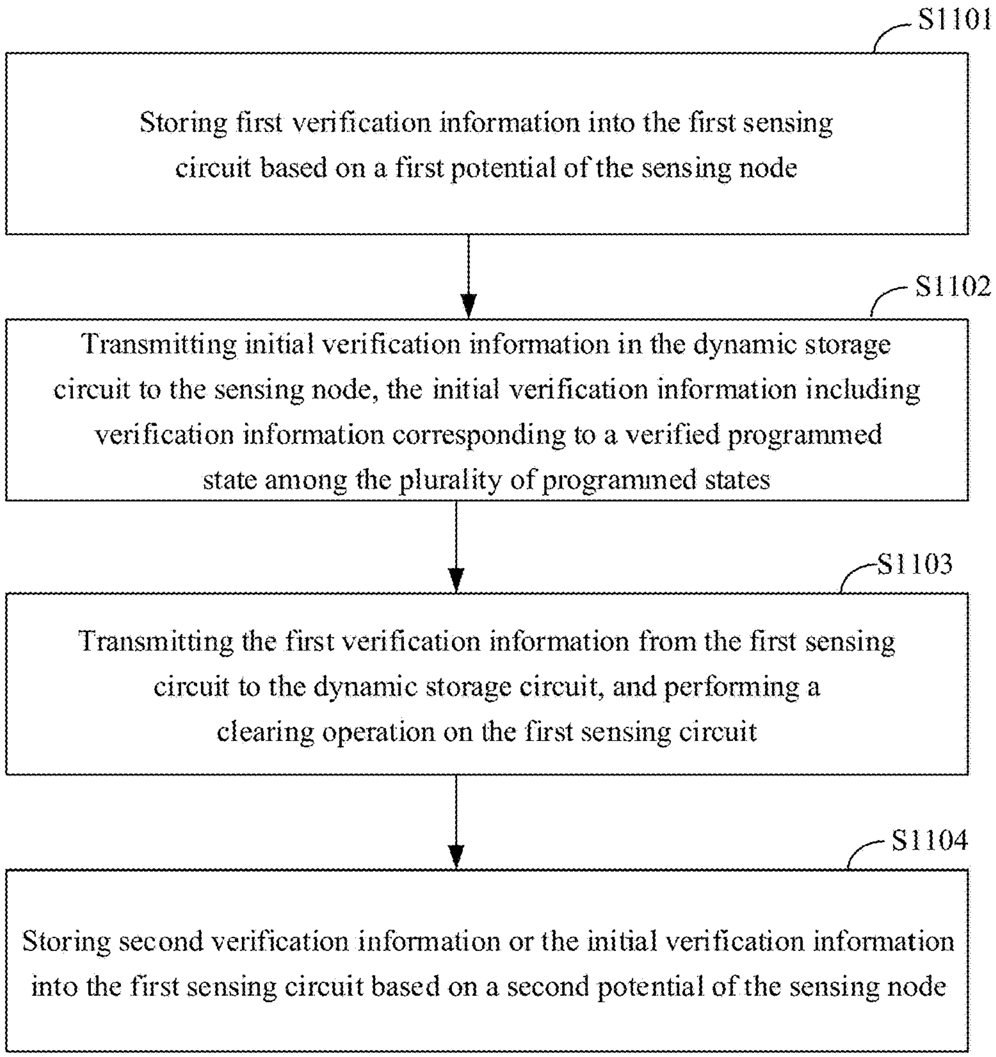
FIG. 11 is a schematic flowchart of an operation method of a memory in accordance with some aspects of the present application.

Based on above, as shown in FIG. 11, an implementation of the present application provides an operation method of a memory, which can solve the above problems. The memory to which the operation method is applicable may include a page buffer, and the page buffer includes a first sensing circuit coupled to the sensing node and a dynamic storage circuit coupled to the first sensing circuit; a memory cell included in the memory is configured to store one of a plurality of programmed states. In an example, the operation method may include:

- S1101: storing first verification information into the first sensing circuit based on a first potential of the sensing node;
- S1102: transmitting initial verification information in the dynamic storage circuit to the sensing node, the initial verification information including verification information corresponding to a verified programmed state among the plurality of programmed states;
- S1103: transmitting the first verification information from the first sensing circuit to the dynamic storage circuit, and performing a clearing operation on the first sensing circuit; and
- S1104: storing second verification information or the initial verification information into the first sensing circuit based on a second potential of the sensing node;
- wherein the first potential of the sensing node corresponding to the first verification information is greater than the second potential of the sensing node corresponding to the second verification information.

It should be noted that the structure of the memory described above only describes the structure related to the operation method according to this application. For parts of other structures of the memory, reference may be made to the structure of the memory shown in FIGS. 1 to 6 above. It should be noted that the described structures of the memories shown in FIGS. 1 to 6 are only exemplary rather than limiting. That is to say, the operation method provided in the implementation of the present application can be applied to any memory with the above technical problems.

Figure 12:
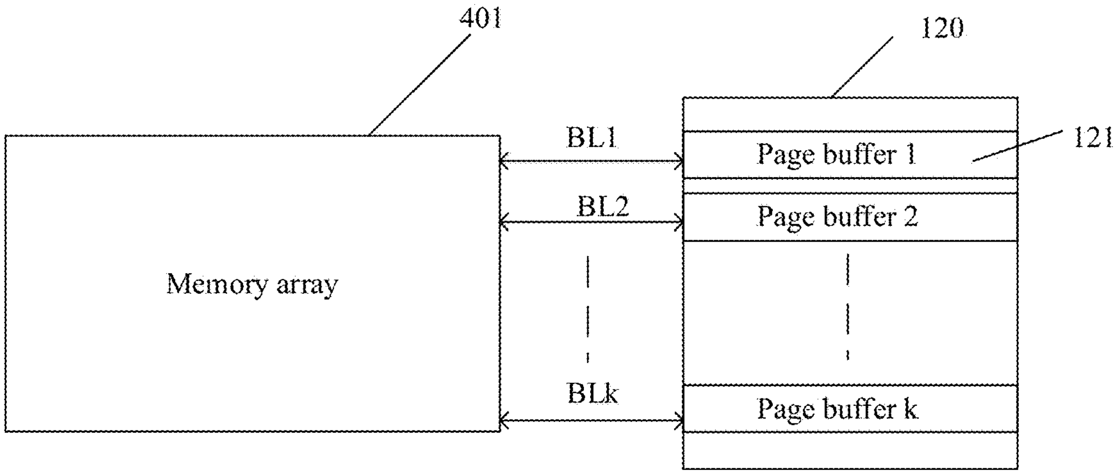
FIG. 12 is a schematic diagram of the relationship between a page buffer group included in a memory and a memory array in accordance with some aspects of the present application.

For the page buffer, as shown in FIG. 12, a schematic structural diagram of the page buffer group included in the memory is shown. In FIG. 12, the page buffer includes the page buffer/sense amplifier 504 as described above. In a memory, each bit line is coupled to a page buffer. That is, in some implementations, the memory may include the page buffer group 120. The page buffer group 120 may be coupled to the memory array 401 via a plurality of bit lines BL1 to BLK. The page buffer group 120 may include page buffer 1 (PB1) to page buffer K (PBK), and each page buffer 121 is coupled to the memory array 401 via a bit line. For example, the page buffers PB1 to PBK may be respectively coupled to the memory array 401 via corresponding bit lines BL1 to BLK.

Here, the page buffer referred to in this application is any one of the aforementioned page buffer groups, and its function includes for example the functions of the aforementioned page buffer/sense amplifier 604. The page buffer may include a first sensing circuit coupled to the sensing node and a dynamic storage circuit coupled to the first sensing circuit. Said first verification information may refer to the verification result obtained through 3BL sensing in the verify operation of the 4BL BIAS programming. Said second verification information may refer to the verification result obtained through 4BL sensing in the verify operation of the 4BL BIAS programming.

In the actual application, according to the memory containing the page buffer with the aforementioned structure, the 3BL sensing and 4BL sensing in the verify operation included in a 4BL BIAS programming cannot be completed in the same sensing when the 4BL BIAS programming are employed for this type of memory due to the limitation of the structure of the dynamic storage circuit (the same sensing can mean that the sensing node is precharged to to the preset initial voltage at the same time, and during the discharge process of the sensing node, 3BL sensing and 4BL sensing are completed at different times). In other words, due to the structural limitations of the dynamic storage circuit, the assistance of the sensing node and the first sensing circuit is needed when caching data. In an example, after the 3BL sensing in the verify operation of the 4BL BIAS programming is completed, the first sensing circuit latches the first verification information; after that, if 4BL sensing is performed again, since the first sensing circuit stores the first verification information and the potential on the sensing node contains the second verification information, that is, the sensing node and the first sensing circuit are both occupied at this time, the sensing node cannot help transmit the first verification information in the first sensing circuit to the dynamic storage circuit, then the second verification information on the sensing node cannot be correctly latched by the first sensing circuit, that is, the second verification information cannot be stored correctly. That is, the 3BL sensing and 4BL sensing in the verify operation of the 4BL BIAS programming cannot be completed in the same sensing. To solve the above problems, according to the implementation provided by the present application, the initial verification information in the dynamic storage circuit is first transmitted to the sensing node; then, the first verification information is transmitted from the first sensing circuit to the dynamic storage circuit, and a clearing operation is performed on the first sensing circuit. Based on this, the second verification information can be latched again after the data in the first sensing circuit is cleared.

In some implementations, the page buffer further includes a second sensing circuit coupled to the sensing node; and the operation method further includes:

- storing third verification information into the second sensing circuit based on a third potential of the sensing node;
- wherein the second potential of the sensing node corresponding to the second verification information is greater than the third potential of the sensing node corresponding to the third verification information.

It should be noted that the third verification information mentioned herein may refer to the verification result obtained through Pass sensing in the verify operation of the 4BL BIAS programming.

That is, according to the operation method described above, in the verify operation of the 4BL BIAS programming, the initial verification information in the dynamic storage circuit is first transmitted to the sensing node after the first sensing circuit latches the first verification information; then, the first verification information is transmitted from the first sensing circuit to the dynamic storage circuit, and the first sensing circuit is cleared; and then, the second verification information is latched into the first sensing circuit; and afterwards, the third verification information is latched into the second sensing circuit. In this way, the verify operation of 4BL BIAS programming can precharge the sensing voltage only once at the same verify voltage, and then the sensing voltage is sensed at three different time points during the discharge to complete 3BL sensing, 4BL sensing and Pass sensing.

The initial verification information described herein may include verification information corresponding to a verified programmed state among the plurality of programmed states. The programmed state contained in the memory cells corresponding to the page buffer including the dynamic memory storing the initial verification information has been verified. In some implementations, the initial verification information may include a verification result obtained through 4BL sensing corresponding to the verified programmed state among the plurality of programmed states.

In some implementations, the dynamic storage circuit corresponding to a first memory cell in a programmed state to be verified or a second memory cell in a verified programmed state that fails verification among the plurality of programmed states is in an initial state.

It should be noted that said first memory cell may include a memory cell corresponding to a programmed state to be verified among said plurality of programmed states, for example, a memory cell corresponding to a Pn programmed state among said plurality of programmed states. The second memory cell may include a memory cell in a verified programmed state that fails verification adjacent to the programmed state to be verified, among said plurality of programmed states, for example, a memory cell in the Pn−1 programmed state that fails verification among said plurality of programmed states. What is described here is that the dynamic storage circuit included in the page buffer corresponding to the first memory cell and the second memory cell is in an initial state and has not been operated. That is, the data stored in the dynamic storage circuit included in the buffers of the first memory cell and the second memory cell may be initial default data. The initial default data can be used to indicate that the dynamic storage circuit is in a reset state and can be operated. In some implementations, this initial default data may be 1.

In some implementations, the page buffer further includes at least one data latch circuit; and the operation method further includes: before storing first verification information into the first sensing circuit based on a first potential of the sensing node:

- obtaining selected operation information based on data information in the at least one data latch circuit and the initial verification information in the dynamic storage circuit, the selected operation information being configured to select the first memory cell in the programmed state to be verified or the second memory cell in the verified programmed state that fails verification among the plurality of programmed states;
- storing the selected operation information into the second sensing circuit; and
- precharging the sensing nodes corresponding to the first memory cell and the second memory cell to a preset initial voltage based on the selected operation information.

It should be noted that said at least one data latch circuit can be used to temporarily store data to be programmed into the memory array or temporarily store data read from the memory array. In some implementations, each page buffer may include more than two data latch circuits.

For example, when the memory cell is a TLC-type memory cell, the memory cell can store 3-bit data, which are respectively Low Page (LP) data, Middle Page (MP) data, and Up Page (UP) data. Correspondingly, the page buffer may include three data latches, including LP latch, MP latch and UP latch respectively. When the memory cell is a QLC memory cell, the memory cell can store 4-bit data, which are LP data, MP data, UP data, and Extra Page (XP) data respectively. Correspondingly, the page buffer can include four data latches: LP latch, MP latch, UP latch, and XP latch.

It should be noted that the above example is only an exemplary correspondence between the number of data latch circuits in the page buffer and the number of data bits stored in the memory cells. In practical applications, the number of data latch circuits may also be less than the number of bits stored in the memory cell. For example, some data latch circuits may be designed as dynamic latch circuits.

It is described here that before sensing the aforementioned first verification information, the second verification information and the third verification information, it is first required to precharge the sensing node coupled to the selected memory unit. The selected memory cell described herein may refer to the aforementioned first memory cell and second memory cell. The process of precharging the sensing node coupled to the selected memory cell may include: first obtaining selected operation information based on the data information in at least one data latch circuit and the initial verification information in the dynamic storage circuit to determine the selected memory cell, and then storing the selected operation information into the second sensing circuit, so that the second sensing circuit precharges the sensing nodes corresponding to the first memory cell and the second memory cell to a preset initial voltage based on the selected operation information during operation. The preset initial voltage may be determined according to design. The data information described herein may refer to data that is programmed, written into the memory array and undergoes set encoding. For example, the set encoding may be Gray encoding. For the understanding of this operation, reference may be made to the detailed description in FIG. 17 and FIG. 18 below, and details are not repeated herein.

In some implementations, operation S1102 may include:

charging the sensing node corresponding to a third memory unit in the verified programmed state that passes verification among the plurality of programmed states based on the initial verification information, so as to transmit the initial verification information to the sensing node.

Here, the third memory cell may include a memory cell in a verified programmed state adjacent to the programmed state to be verified that passes verification among the plurality of programmed states, for example, a memory cell in the Pn−1 programmed state that passes verification among said plurality of programmed states. The aforementioned process of transmitting the initial verification information in the dynamic storage circuit to the sensing node may be as follows: charging the sensing node corresponding to the third memory cell based on the initial verification information, so as to transmit the initial verification information to the sensing node. Here, operation S1102 can also include: reading the initial verification information onto the sensing node.

The specific implementation of the above operation 1102 will be described below by taking the programmed state to be verified as the Pn programmed state and the verified programmed state as the Pn−1 programmed state as an example.

Figure 13:
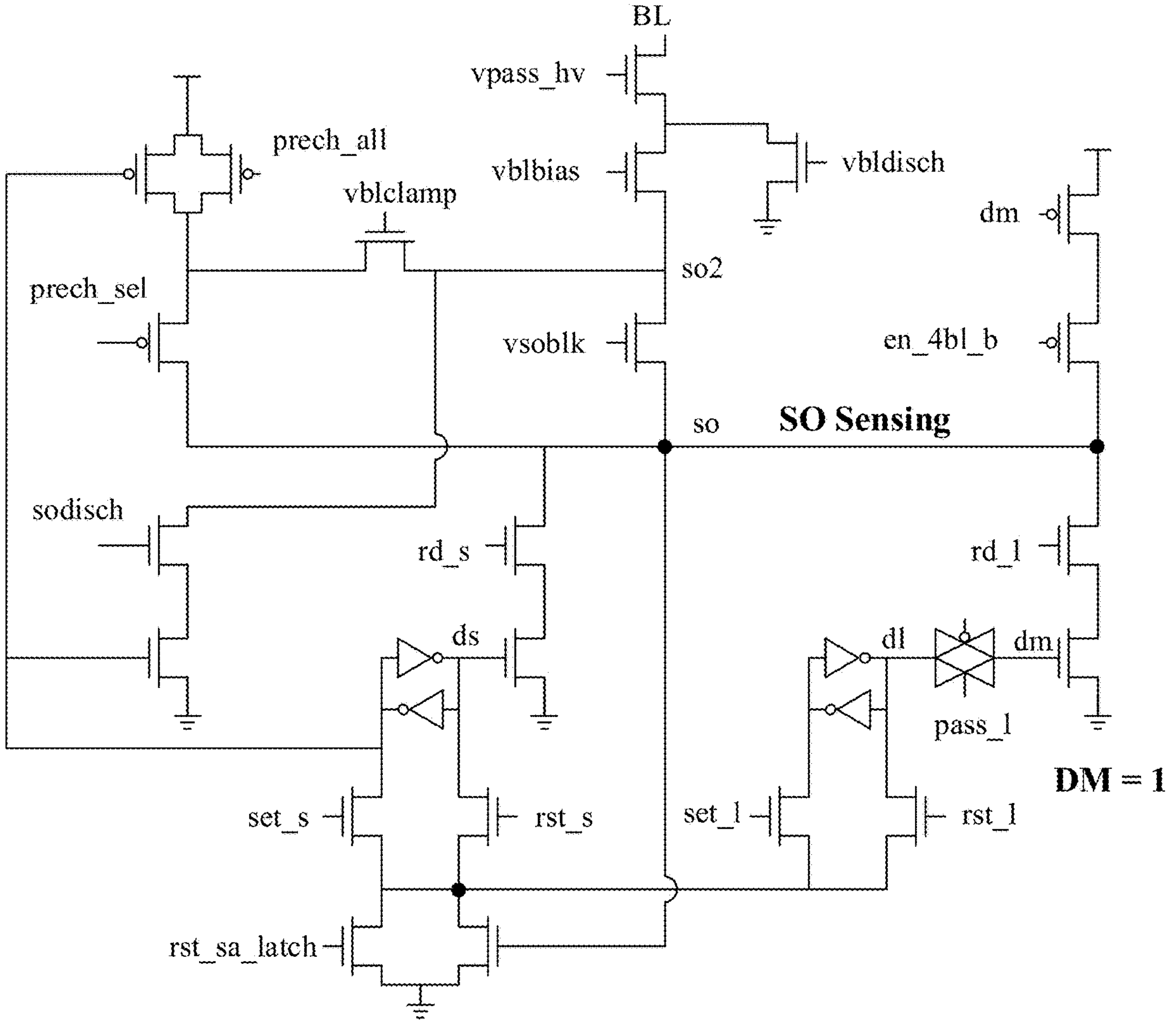
FIGS. 13-16 are schematic diagrams of statuses of the sensing nodes corresponding to a first memory cell, a second memory cell, and a third memory cell before and after initial verification information in the dynamic storage circuit is transmitted to a sensing node in accordance with some aspects of the present application.
Figure 14:
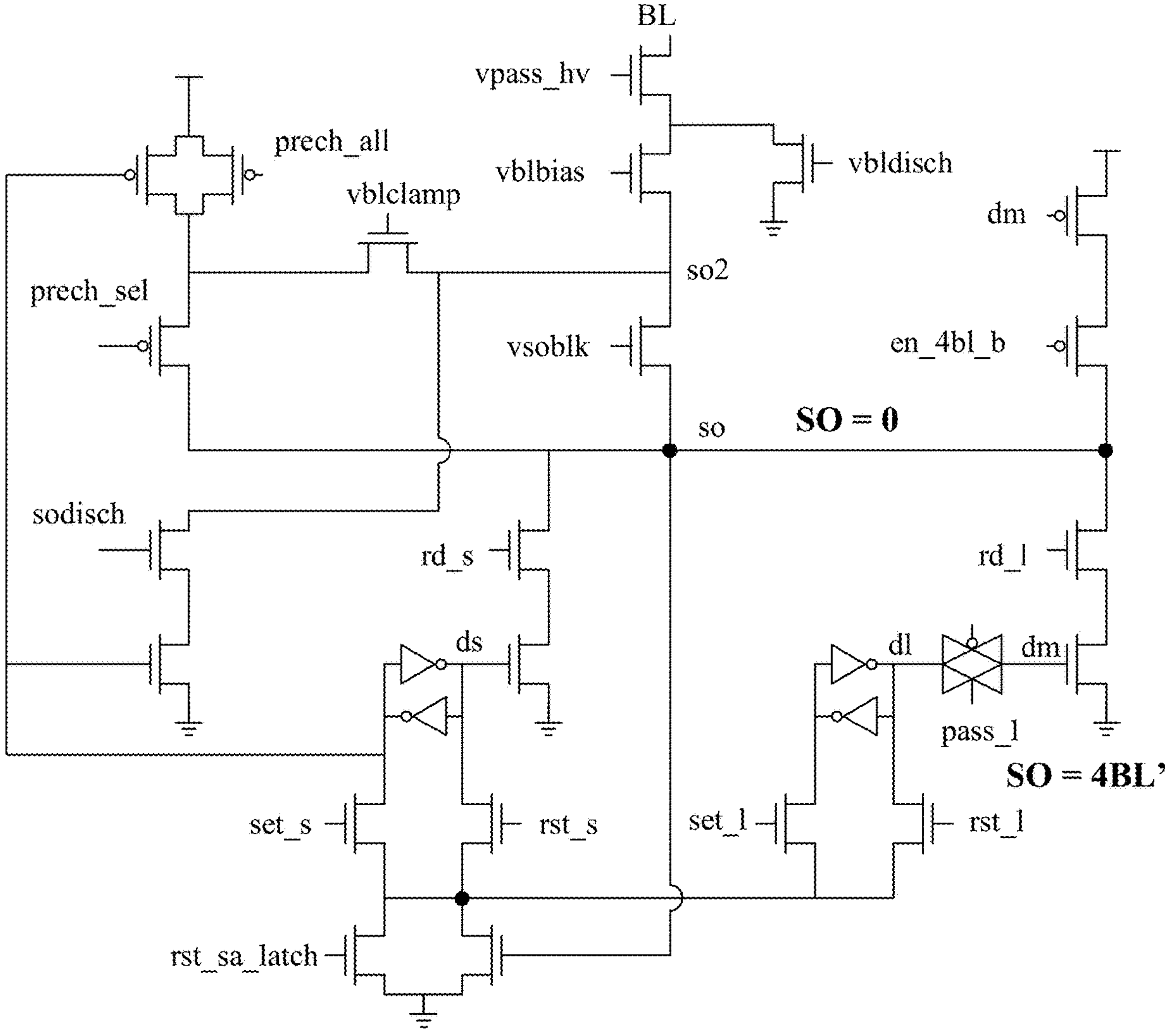
Figure 15:
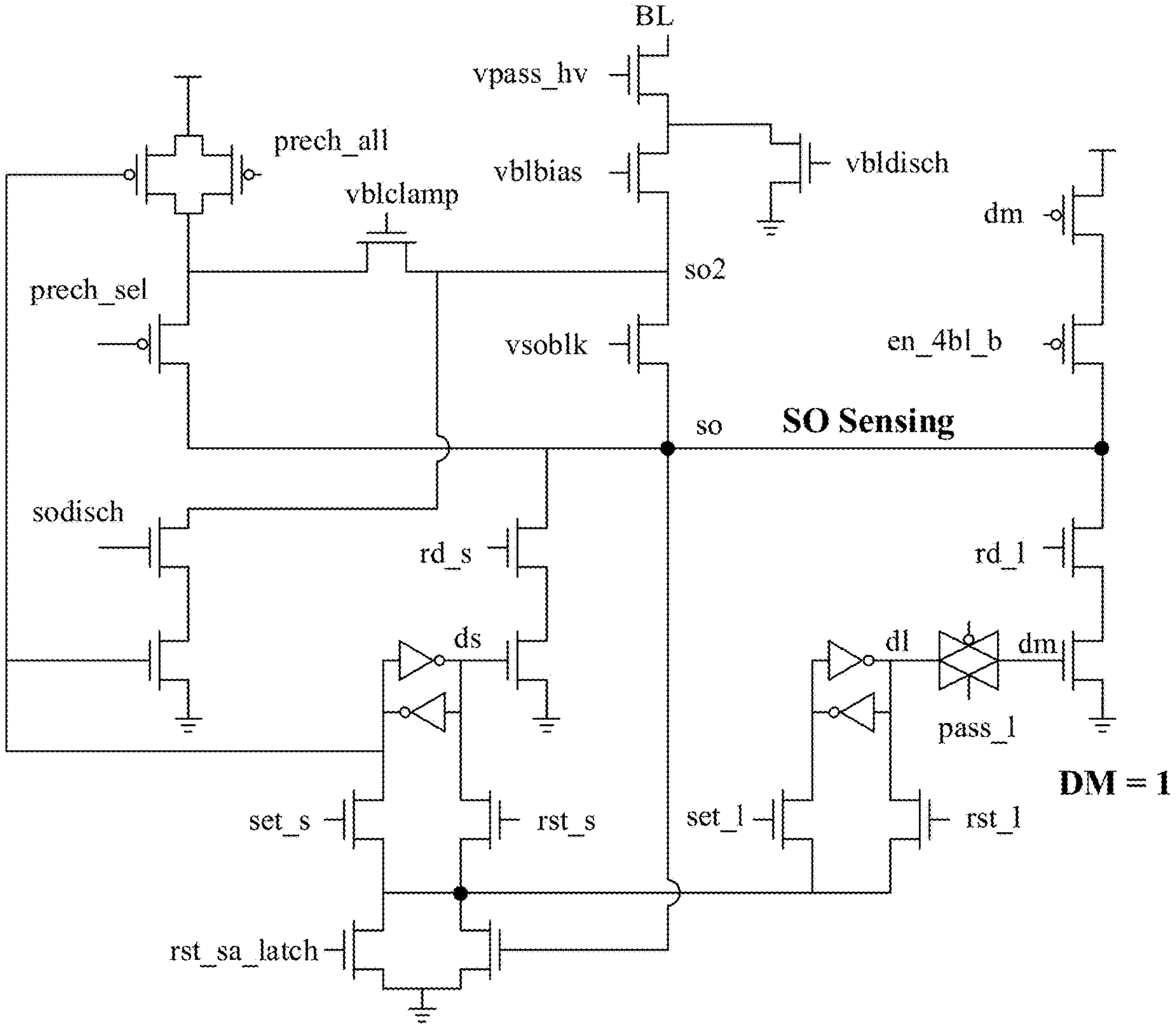
Figure 16:
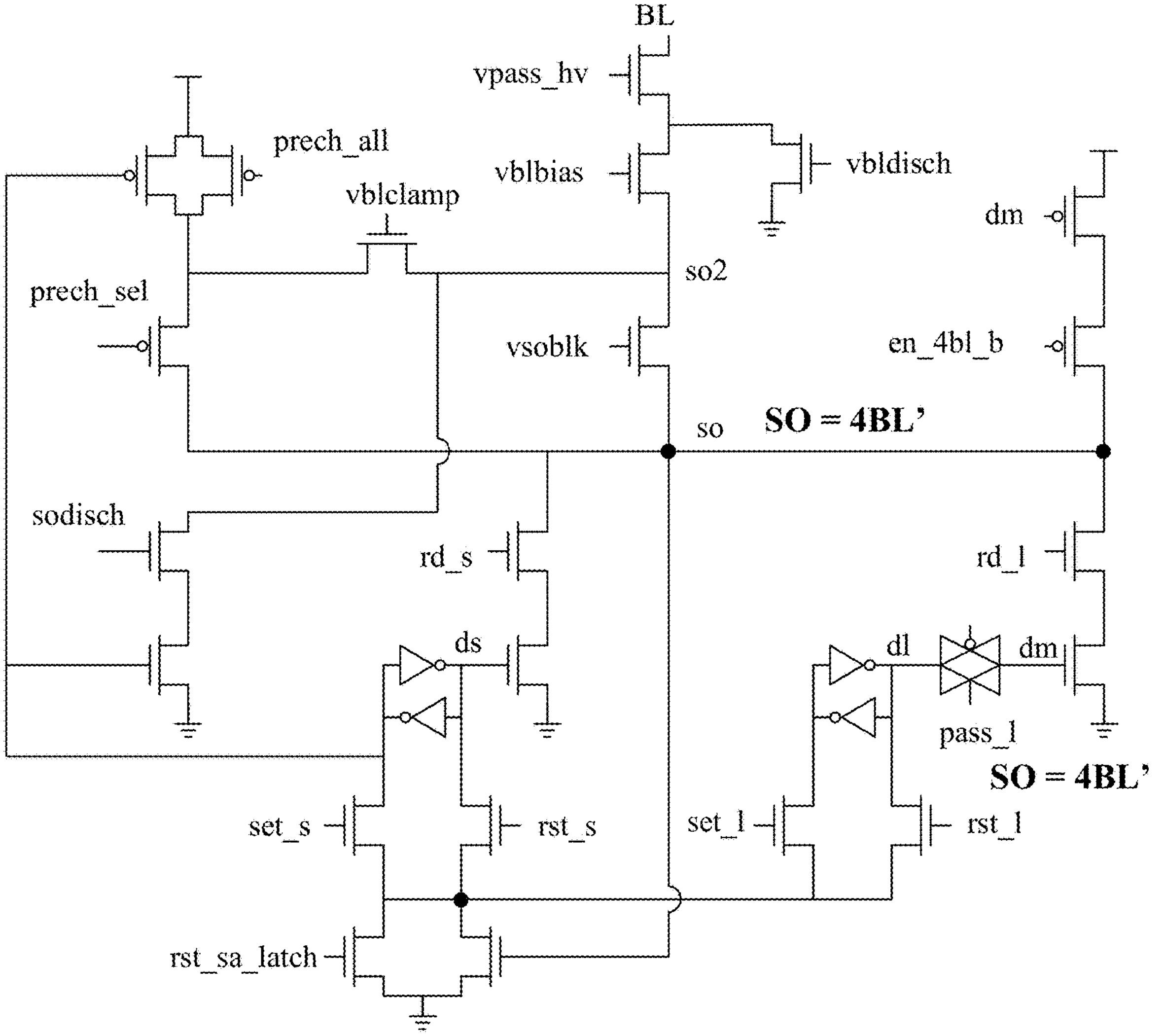

In an example, as shown in FIGS. 13 to 16 and Tables 1 to 3, FIG. 13 is a schematic diagram of the statuses of the sensing node and the dynamic storage circuit in the page buffer corresponding to the first memory cell corresponding to the Pn programmed state before transmitting the initial verification information in the dynamic storage circuit to the sensing node in accordance with some aspects of the present application; FIG. 14 is a schematic diagram of the statuses of the sensing node and the dynamic storage circuit in the page buffer corresponding to the third memory cell corresponding to the Pn−1 programmed state before transmitting the initial verification information in the dynamic storage circuit to the sensing node in accordance with some aspects of the present application; FIG. 15 is a schematic diagram of the statuses of the sensing node and the dynamic storage circuit in the page buffer corresponding to the first memory cell corresponding to the Pn programmed state after transmitting the initial verification information in the dynamic storage circuit to the sensing node in accordance with some aspects of the present application; and FIG. 16 is a schematic diagram of the statuses of the sensing node and the dynamic storage circuit in the page buffer corresponding to the second memory cell corresponding to the Pn−1 programmed state after transmitting the initial verification information in the dynamic storage circuit to the sensing node in accordance with some aspects of the present application. Table 1 shows the statuses of the first sensing circuit, the dynamic storage circuit and the sensing node in the page buffer corresponding to the first memory cell corresponding to the Pn programmed state, the page buffer corresponding to the second memory cell corresponding to the Pn−1 programmed state, and the page buffer corresponding to the third memory cell corresponding to the Pn−1 programmed state before the initial verification information in the dynamic storage circuit is transmitted to the sensing node; Table 2 shows the statuses of the first sensing circuit, the dynamic storage circuit, and the sensing node in the page buffer corresponding to the first memory cell corresponding to the Pn programmed state, the page buffer corresponding to the second memory cell corresponding to the Pn−1 programmed state, and the page buffer corresponding to the third memory cell corresponding to the Pn−1 programmed state after the initial verification information in the dynamic storage circuit is transmitted to the sensing node; and Table 3 shows the statuses of the first sensing circuit, the dynamic storage circuit, and the sensing node in the page buffer corresponding to the first memory cell corresponding to the Pn programmed state, the page buffer corresponding to the second memory cell corresponding to the Pn−1 programmed state and the page buffer corresponding to the third memory cell corresponding to the Pn−1 programmed state after SO discharge again (4BL sensing) subsequently to 3BL sensing.

In FIG. 13, the ds latch may be an exemplary structure of the aforementioned second sensing circuit, the d1 latch may be an exemplary structure of the aforementioned first sensing circuit, and the dm transistor and its corresponding parasitic capacitance may be an exemplary structure of the aforementioned dynamic storage circuit.

FIG. 13 shows the potential situation corresponding to the SO when the SO corresponding to the first memory cell corresponding to the Pn programmed state has completed 3BL sensing and 3BL verification data latching before the initial verification information in the dynamic storage circuit included in the page buffer is transmitted to the sensing node and the SO is also discharged again (4BL sensing), in which the potential situation is expressed as SO="sensing". In the implementation of the present application, since the selected memory cell is the first memory cell in the Pn programmed state and the second memory cell in the Pn−1 programmed state that fails the 4BL verification during the selection operation, the same verify operation as the first memory cell is also performed on the second memory cell at this time. That is, 3BL sensing and 3BL verification data latching are also carried out, and the SO is also discharged again (4BL sensing). At this time, the potential situation of the SO corresponding to the second memory cell may also be expressed as SO="sensing". The potential situation of the SO of the second memory cell in the Pn−1 programmed state before the initial verification information in the dynamic storage circuit included in the page buffer is transmitted to the sensing node can be understood by referring to FIG. 13. But for the dynamic storage circuits corresponding to the first memory cell and the second memory cell, since the data latch of 4BL sensing is not performed on the first memory cell, its dynamic storage circuit is in an initial state, for example, DM="1". Since the second memory cell is a memory cell that has failed 4BL verification, and the data latching of 4BL sensing has been performed on the dynamic storage circuit, the data stored in its dynamic storage circuit is the verification result of 4BL sensing (failed 4BL verification). At this time, the dynamic storage circuit corresponding to the second memory cell is DM="4BL'".

The structure of the page buffer shown in FIG. 14 is the same as that of the page buffer shown in FIG. 13, which has been described in detail above and will not be repeated here.

FIG. 14 shows the situations where the third memory cell corresponding to the Pn−1 programmed state is not discharged at least once since it is an unselected memory cell and thus its corresponding SO has not been precharged to the preset initial voltage before the initial verification information in the dynamic storage circuit in the page buffer is transmitted to the sensing node. At this time, the potential of the SO corresponding to the third memory cell will not change, which can be represented by SO="0". In addition, the state of the dynamic sensing circuit corresponding to the third memory cell is DM=4BL', where 4BL' is the verification result of the third memory cell via 4BL sensing (4BL verification passed). Here, although the dynamic storage circuits of the second memory cell and the third memory cell store 4BL', it should be understood that the specific states are different, and the specific values stored are different. In some implementations, the dynamic storage circuit corresponding to the second memory cell is DM=4BL'="1", the dynamic storage circuit corresponding to the third memory cell is DM=4BL'="0", and the two represent opposite states.

In an example, the states described in FIG. 13 and FIG. 14 are the same as those described in Table 1.

TABLE 1

| | Pn-1 | Pn |
|---|---|---|
| DM (or dm) | 4BL | 1 |
| SO | 0 | sensing |
| DS (or ds) | ~4BL/0 | 1 |

The structure of the page buffer shown in FIG. 15 is the same as that of the page buffer shown in FIG. 13 and FIG. 14, which have been described in detail above and will not be repeated here. In an example, FIG. 15 shows the potential situation of SO in the page buffer corresponding to the first memory cell corresponding to the Pn programmed state after the initial verification information in the dynamic storage circuit is transmitted to the sensing node. Since no control signal en_4bl_b is applied to the page buffer in the Pn programmed state, the page buffer corresponding to the first memory cell corresponding to the Pn programmed state does not perform the operation of transmitting the initial verification information in the dynamic storage circuit to the sensing node, and the potential of SO remains at the potential of 4BL sensing. Therefore, it can still be expressed as: SO="sensing". Correspondingly, since the SO corresponding to the second memory cell operates the same as the first memory cell, the potential situation of the SO corresponding to the second memory cell can also be expressed as: SO="sensing". According to the foregoing understandings, the statuses of the dynamic storage circuits of the first memory cell and the second memory cell are still DM="1".

Similarly, in FIG. 16, the structure of the page buffer is the same as that of the page buffer in FIG. 13, FIG. 14, and FIG. 15, which have been described in detail above and will not be repeated here. In an example, after the initial verification information in the dynamic storage circuit is transmitted to the sensing node, the potential of the sensing node of the page buffer corresponding to the third memory cell corresponding to the Pn-1 programmed state is illustrated. The control signal en_4bl_b is applied to the page buffer corresponding to the third memory cell. Therefore, the potential of SO corresponding to the third memory cell corresponding to the Pn−1 programmed state is pulled up, that is, the page buffer corresponding to the third memory cell performs the operation of transmitting the initial verification information in the dynamic storage circuit to the sensing node. The potential of SO of the third memory cell can be expressed as SO="4BL". Correspondingly, the state of the dynamic storage circuit corresponding to the third memory cell is DM="4BL'".

In an example, the states described in FIG. 15 and FIG. 16 are the same as those described in Table 2.

TABLE 2

| | Pn-1 | Pn |
|---|---|---|
| DM (or dm) | 4BL | 1 |
| SO | 4BL | sensing |
| DS (or ds) | ~4BL/0 | 1 |

Based on the description of the state of each device related to the technical solution of the present application in the page buffer shown in FIGS. 13 to 16, it can be known that before the initial verification information in the dynamic storage circuit is transmitted to the sensing node, since the first memory cell and the second memory cell are memory cells to be verified currently, the sensing nodes corresponding to the first memory cell and the second memory cell will be precharged to a preset initial voltage, and then discharged. 3BL sensing and 4BL sensing are performed. Therefore, the potential of the sensing node of the page buffer corresponding to the first memory cell corresponding to the Pn programmed state and the sensing node of the page buffer corresponding to the second memory cell corresponding to the Pn−1 programmed state can be expressed as SO="sensing". The third memory cell is a memory cell that has been verified and passes verification, and therefore, its corresponding sensing node is not precharged to a preset initial voltage. That is, before the initial verification information in the dynamic storage circuit is transmitted to the sensing node, the potential of the sensing node corresponding to the third memory cell can be expressed as SO="0". After the initial verification information in the dynamic storage circuit is transmitted to the sensing node, since the currently verified Pn programmed state has no 4BL data and the 4BL data corresponding to the Pn−1 programmed state that has not passed the 4BL is the data that failed verification, the control signal en_4bl_b will not be applied to the page buffer corresponding to the first memory cell corresponding to the Pn programmed state and the second memory cell corresponding to the Pn−1 programmed state that has not passed the 4BL. Thus, the operation of transmitting (or reading) the initial verification information in the dynamic storage circuit to the corresponding SO will not be performed. Therefore, the SO will not be charged (pre-charged), that is, the sensing on the SO will not be affected. The page buffer corresponding to the third memory cell is applied with the control signal en_4bl_b and its dynamic storage circuit stores the initial verification information (that is, the verification result of 4BL sensing that passes program verification). Therefore, the page buffer corresponding to the third memory cell performs the operation of reading the initial verification information to the corresponding SO, thereby reading the initial verification information onto the SO.

Here, Table 3 shows the statuses of the second sensing circuit, the dynamic storage circuit and the sensing nodes of the first memory cell, the second memory cell and the third memory cell after the storage of the first verification information.

TABLE 3

| | Pn-1 | Pn |
|---|---|---|
| DM (or dm) | 3BL | 3BL |
| SO | 0 | sensing |
| DS (or ds) | ~4BL/0 | 1 |

In some implementations, the transmitting the first verification information from the first sensing circuit to the dynamic storage circuit in operation S1103 may include:

enabling a transmission channel between the first sensing circuit and the dynamic storage circuit such that the first verification information in the first sensing circuit is transmitted to the dynamic storage circuit.

It should be noted that data transmission can be performed between the first sensing circuit and the dynamic storage circuit, and there is a storage channel therebetween. Therefore, in order to store the first verification information from the first sensing circuit into the corresponding storage circuit, the transmission channel therebetween needs to be enabled first, and then the first verification information in the first sensing circuit is transmitted to the corresponding dynamic storage circuit.

In some implementations, the performing a clearing operation on the first sensing circuit in operation 1103 may include:

resetting the first sensing circuit to restore the first sensing circuit into an initial state.

It should be noted that, in order to be able to store the second verification information, the first sensing circuit needs to be cleared before storing. That is, the first sensing circuit is reset to restore the first sensing circuit to its initial state, for example, to restore the first sensing circuit into d1="1".

In some implementations, the operation method further includes:

discharging the sensing node from the preset initial voltage, suspending discharging the sensing node after a first preset duration, sensing the first potential of the sensing node, and storing the first verification information into the first sensing circuit;

discharging the sensing node from the first potential, suspending discharging the sensing node after a second preset duration, sensing the second potential of the sensing node after the first sensing circuit is cleared, and storing the second verification information into the first sensing circuit; and discharging the sensing node from the second potential, suspending discharging the sensing node after a third preset duration, sensing the third potential of the sensing node, and storing the third verification information into the second sensing circuit.

In some implementations, the operation method further includes:

if the first potential is greater than or equal to a first preset voltage, the first verification information is configured to indicate a first group of memory cells that have passed verification with a first verify voltage among the first memory cell and the second memory cell;

if the second potential is greater than or equal to a second preset voltage, the second verification information is configured to indicate a second group of memory cells that have passed verification with a second verify voltage among the first memory cell and the second memory cell; and if the third potential is greater than or equal to a third preset voltage, the third verification information is configured to indicate a third group of memory cells that have passed verification with a third verify voltage among the first memory cell and the second memory cell;

wherein the first verify voltage is less than the second verify voltage, and the second verify voltage is less than the third verify voltage.

It should be noted that what is described here is that after the sensing node is precharged to the preset initial voltage, and after three discharges, implementing the verify operation of the 4BL BIAS programming enables precharging the bit line once at the same verify voltage, and then sensing is performed at three different time points during the discharge, so as to complete 3BL sensing, 4BL sensing and Pass sensing.

In an example, the sensing nodes corresponding to the aforementioned first memory cell and the second memory cell are precharged to a preset initial voltage. After discharging for a first preset duration, the first potential of the sensing node is lower than the predetermined initial voltage. The first potential of the corresponding sensing node is sensed, and the first verification information is stored. Obtaining the first verification information may include: comparing the first potential with the first preset voltage to obtain the first verification information, and latching the first verification information. Afterwards, the sensing node is discharged from the first potential for a second preset duration, and then a second potential of the sensing node is sensed. Second verification information is obtained based on a comparison between the second potential and a second preset voltage, and finally the second verification information is stored. Similarly, the sensing node is discharged from the second potential for a third preset duration, and then a third potential of the sensing node is sensed. Third verification information is obtained based on a comparison between the third potential and the third preset voltage, and finally the third verification information is stored. The first preset duration, the second preset duration and the third preset duration may be different. In some implementations, the first preset duration is shorter than the second preset duration, and the second preset duration is shorter than the third preset duration.

In the implementation of the present application, by charging the sensing node at the initial moment, only one charging operation is required to complete at least three verify operations in sequence, which reduces the number of times of charging the sensing node during the sensing and saves verification time.

In this implementation, taking the ISPP programming scheme of a 3D NAND flash memory device as an example, in different programming stages of an ISPP programming process, the bit lines of memory cells of different bit lines are biased with different bit line voltages in order to optimize the threshold voltage distribution to make the threshold voltages of memory cells relatively more concentrated in the threshold voltage region of the corresponding data state. That is, bit line forcing operation is implemented. In this way, the effect will be different, even if the program voltages Vpgm (applied via bit line) of gates of memory cells of different bit lines are the same. The threshold voltage difference of memory cells with large current threshold voltage difference is reduced after being programmed and tends relatively to the ideal threshold voltage region of the corresponding data.

In some implementations, the operation method may further include:

applying different bit line voltages to bit lines coupled to the first memory cell based on the first verification information, the second verification information, and the third verification information;

wherein a first bit line voltage is applied to a first bit line connected to a first forced cell; a second bit line voltage is applied to a second bit line connected to a second forced cell; a program inhibition bit line voltage is applied to a third bit line connected to a third group of memory cells; the first forced cell is a memory cell in the first group of memory cells except the second group of memory cells and the third group of memory cells; and the second forced cell is a memory cell in the second group of memory cells except for the third group of memory cells.

It should be noted that, in the implementation of the present application, it is possible to implement a programming in which two kinds of bit line forcing operations are adopted for different memory cells in one programming process based on the first verification information, the second verification information, and the third verification information. In this way, the memory cells can be prevented from being overprogrammed, thereby reducing the width of the threshold voltage distribution of multiple memory cells and improving the accuracy of the program operation.

In an example, the control logic circuit of the memory is configured to: based on the first verification information, the second verification information and the third verification information, apply the first bit line voltage to the first bit line connected to the first forced cell, apply the second bit line voltage to the second bit line connected to the second forced cell, apply the program inhibiting bit line voltage to the third bit line connected to the third group of memory cells, and apply the programming voltage to the selected word line; wherein the first bit line voltage is greater than the ground voltage and less than the program inhibition bit line voltage, and the second bit line voltage is greater than the first bit line voltage. Here, the first forced cell is a memory cell in the first group of memory cells except the second group of memory cells and the third group of memory cells; and the second forced cell is a memory cell in the second group of memory cells except for the third group of memory cells. The first group of memory cells may refer to the first group of memory cells, and the first group of memory cells includes the memory cell of the first memory cell and the second memory cell that has passed the verification with the first verify voltage. The second group of memory cells may refer to the second group of memory cells, and the second group of memory cells includes the memory cell of the first memory cell and the second memory cell that has passed the verification with the second verify voltage. The third group of memory cells may be the memory cell of the first memory cell and the second memory cell that has passed the verification with the third verify voltage.

In some implementations, the control logic circuit is further configured to apply the normal program bit line voltage Vprog (e.g., the ground voltage Vgnd) to the memory cells undergoing normal program operation based on the first verification information, the second verification information and the third verification information. Here, the program inhibition bit line voltage Vinh may be the power supply voltage Vdd, the first bit line voltage is greater than the ground voltage (normal program bit line voltage Vprog) and less than the program inhibition bit line voltage Vinh, and the second bit line voltage is greater than the first bit line voltage and less than the program inhibition bit line voltage Vinh.

During the programming such as ISPP, when the same program voltage Vpgm is applied to the memory cells of a certain selected row to perform the program operation, the sensing circuit can use the first verification information DL, the second verification information DM and the third verification information DS to apply the corresponding bit line voltage to the corresponding memory cells, so that bit line forcing operations may be distinctly performed on the memory cells. In other words, in the implementation of the present application, different memory cells are classified for program control. The memory cells can be divided into normal program cells, first forced cells to undergo the first bit line forcing operation, second forced cells to be subjected to the second bit line forcing operation, and third memory cells to be subjected to program inhibit operations. Different bit line voltages are used to perform classified program control on these 4 types of memory cells. During the program operation, if only one forced bit line voltage (which is greater than the normal program bit line voltage Vprog and less than the program inhibition bit line voltage Vinh) is added to perform program operations on multiple forced cells in addition to two bit line voltages including the program inhibition bit line voltage Vinh (such as Vdd) and the normal program bit line voltage Vprog (such as the ground voltage Vgnd), a program operation with a certain programming degree of difference is enabled, but the threshold voltage distribution of multiple memory cells after being programmed may not be narrow enough. Therefore, in the program operation of this implementation, in addition to the two bit line voltages including the program inhibition bit line voltage Vinh (such as VDD) and the normal program bit line voltage Vprog (such as the ground voltage Vgnd), the first bit line voltage and the second bit line voltage (both of which are greater than the normal program bit line voltage Vprog and less than the program inhibition bit line voltage Vinh) are used, so as to perform a program operation with a finer programming degree of difference for a plurality of memory cells.

In some implementations, the operation method further includes:

after applying different bit line voltages to the bit line coupled to the first memory cell, determining whether the programmed state to be verified is a last programmed state among the plurality of programmed states; and if it is determined that the programmed state to be verified is not the last programmed state, performing an exchange operation on the first sensing circuit and the dynamic storage circuit such that the second verification information is stored in the dynamic storage circuit, and the first verification information is stored in the first sensing circuit.

It should be noted that, as described above, the memory provided by the implementation of the present application includes multiple programmed states. After different bit line voltages are applied to the first memory cell according to the first verification information, second verification information and third verification information corresponding to the programmed states to be verified, the verification of the programmed state to be verified has been completed, and the next programming is guided according to the information obtained through verification. It is required to determine whether the programmed state to be verified is the last programmed state. If it is not the last programmed state, exchange operation between the first sensing circuit and the dynamic storage circuit is required so that the second verification information is stored in the dynamic storage circuit and the first verification information is stored in the first sensing circuit. That is, the two-way data transmission between the first sensing circuit and the dynamic storage circuit realizes the exchange of data, and then prepares for the verification of the next programmed state. If the programmed state to be verified is the last programmed state, the verification is ended.

In some implementations, the programming of the memory includes at least one round of programming loop; the programming loop includes: a program operation and a verify operation; and the operation method may further includes:

before the verify operation, performing a clearing operation on the first sensing circuit and the dynamic storage circuit.

It should be noted that, as mentioned above, the verify operation performed between two program operations includes the verification of each of the multiple programmed states. Therefore, before the verify operation mentioned herein may mean before the verify operation of the first programmed state in the multiple programmed states contained in the memory. The operation herein means that before the verify operation, the first sensing circuit and the dynamic storage circuit are cleared, or in other words, before the current verify operation, the data stored in the first sensing circuit and the dynamic storage circuit in the previous verify operation or program operation is cleared. That is, the first sensing circuit and the dynamic storage circuit are reset and restored to the initial state for later use.

Figure 17:
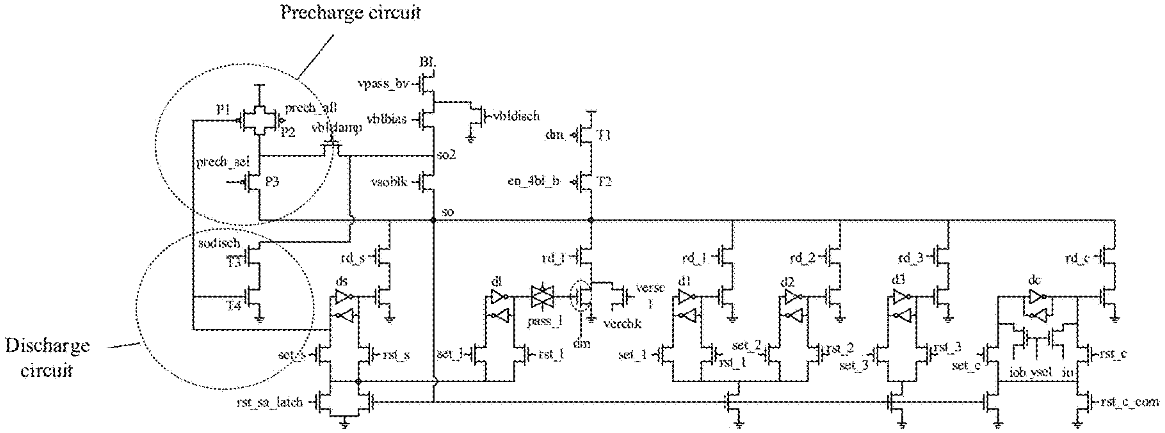
FIG. 17 is a schematic diagram of a circuit structure of a page buffer 121 in accordance with some aspects of the present application.
Figure 18:
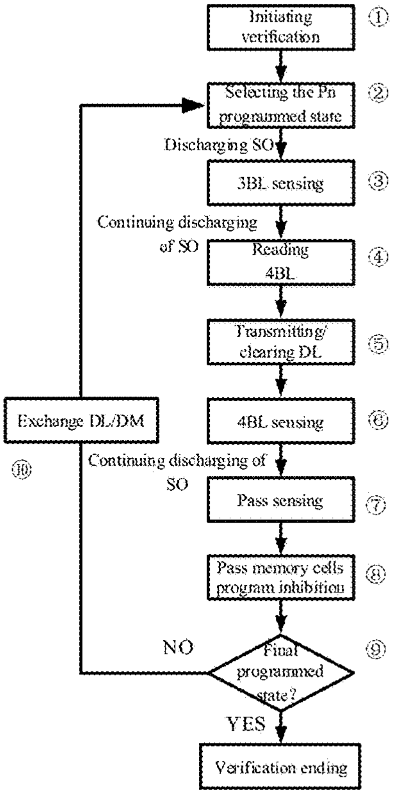
FIG. 18 is a schematic flow diagram of implementing the 4BL BIAS programming by using the operation method provided by the implementation of the present application in accordance with some aspects of the present application.

To understand the operation method provided by the implementation of the present application, reference may be made to FIG. 17 to FIG. 18. FIG. 17 shows a schematic circuit structure diagram of a page buffer, and FIG. 18 shows a schematic flowchart of a verify operation of a complete BL BIAS programming using the operation method provided by the implementation of the present application.

It should be noted that the page buffer shown in FIG. 17 includes at least: a precharge circuit, a discharge circuit, a first sensing circuit d1, a second sensing circuit ds, a dynamic sensing circuit dm, and a data latch circuit (d1, d2, d3, dc).

The precharge circuit is coupled to the corresponding bit line via the sensing node SO, and is configured to be supplied with a power supply voltage (such as VDD). When SO is precharged, a preset initial voltage is provided for the SO. The precharge circuit includes a transmission gate composed of a transistor P1 and a transistor P2 connected in parallel and a transistor P3, and each transistor precharges SO to a preset initial voltage in response to the signal generated by the third verification information stored in the second sensing circuit, the Prech_all signal and the Prech_sel signal. The discharge circuit includes transistors T3 and T4 connected in series, and is configured to discharge the SO in response to the discharge signal sodisch and a signal generated from the third verification information stored in the second sensing circuit, respectively. In addition, the page buffer further includes a first transistor T1 and a second transistor T2 connected in series. Moreover, a terminal of the first transistor is connected to the positive terminal of a power supply (e.g., VDD). A terminal of the second transistor is connected to the sensing node, and the second transistor is controlled by the first transmission signal. The first transistor is controlled by the initial verification information. The first transistor and the second transistor are turned on under the action of the first transmission signal and the initial verification information, and the sensing node corresponding to the third memory cell in the verified programmed state that has passed verification among the multiple programmed states is charged to transmit the initial verification information to the sensing nodes.

In conjunction with the page buffer described in FIG. 17, and without loss of generality, it is assumed that a verify sequence includes programmed states Pn−1, Pn, and Pn+1. Since the selected programmed state is based on the 0 data in D1/D2/D3/DC (d1, d2, d3 and dc), selecting a certain programmed state may select a state lower than this programmed state. Thus, it is assumed that the selection of the Pn state may select Pn−1 at the same time. Take this as an example to introduce the operations of the program verification method of the memory provided by the implementation of the present application, where 3BL data (that is, the first verification information) represents reaching 3BL by 0 and 4BL data (and second verification information) represents reaching 4BL by 0. Referring to the process shown in FIG. 18, in an example, it includes:

1. Starting verification; this operation is described as follows in conjunction with the circuit in FIG. 17. When entering verify from program pulse, the 3BL data in DL is cleared (DL=1), and the 4BL data in DM is cleared (DM=1), so as to enter the verify operation.
2. Selecting the Pn programmed state; selecting the Pn programmed state has been described in detail above, and the selected memory cells to be verified also include memory cells that have not passed the program verification in the Pn−1 programmed state. That is, the selected memory cells include the aforementioned first memory cell and second memory cell. This operation is described in conjunction with the circuit in FIG. 17 as follows: verification of Pn-1 state is similar to that of Pn state, assuming that verification of Pn state is started after verify of Pn−1 is ended, the programmed state operation is selected as DS=DM & P*, where P* performs the operation of selecting the Pn programmed state according to the data in D1/D2/D3/DC, and in DM there is the 4BL data of the Pn−1 programmed state, and therefore, all cells in the Pn state and cells that failed to pass 4BL in the Pn-1 state will be selected in the selection operation.
3. 3BL sensing; before 3BL sensing, the SOs corresponding to the first memory cell and the second memory cell are precharged, and the SOs are precharged to a preset initial voltage. During 3BL sensing, the first verification information is latched into the first sensing circuit DL. This operation is described in conjunction with the circuit in FIG. 17 as follows: SO is precharged by using the data of DS (that is, the aforementioned selected operation information), then SO continues to develop discharge, and after the develop time of t_sodev_3bl, soblk and sodisch are turned off to stop development, and then rst_1 is turned on to sense 3BL data into DL (DL=DL & ~SO), where the symbol & represents logical AND; the symbol ~ represents logical NOT.

4. Reading 4BL; reading 4BL is to transmit the initial verification information in the dynamic storage circuit corresponding to the third memory cell to the corresponding sensing node. The specific process has been described in detail above, and will not be repeated here. This operation is described in conjunction with the circuit in FIG. 17 as follows: turning on soblk and sodisch, and after the develop time of t_sodev_4bl, turning off soblk and sodisch to stop development, and then turning on en_4bl_b to read the 4BL' data in Pn-1 state onto SO (SO=SO|~DM); in this operation, because the Pn state of current verification has no 4BL data, SO in Pn state will not be precharged, and SO sensing will not be affected, where the symbol | represents logical OR, and the expressions on both sides of the symbol will be calculated, and then the true and false judgments will be made.
5. Transmitting/clearing DL; namely: DM=DL; DL="1". Here, corresponding to the above-mentioned clearing operation on the first sensing circuit, the specific operation has been described in detail above, and will not be repeated herein.
6. 4BL sensing; namely: DL=~ SO; on the basis of the 3BL sensing, continuing discharging of the SO for a period of time (such as a second preset duration), and then latching the second verification information into the first sensing circuit DL.

The two operations are described in conjunction with the circuit in FIG. 17 as follows: turning on Pass_1 to transmit 3BL to DM; clearing DL data to prepare for 4BL sensing (DL=1); turning on rst_1 to sense 4BL data to DL (DL=~ SO), where the symbol "=" means value assignment.

7. Pass sensing; on the basis of 4BL sensing, continuing discharging of the SO for a period of time (such as the third preset duration), and then latching the third verification information into the second sensing circuit DS. This operation is described in conjunction with the circuit in FIG. 17 as follows: turning on soblk and sodisch, and after the develop time of t_sodev_Pass, turning off soblk and sodisch to stop develop; clearing the DS data to prepare for Pass sensing (DS=1); turning on rst_s to sense the Pass data to DS (DS=~ SO). During the develop, because sodisch is turned on, the 4BL' data on SO will be cleared by DS.
8. Pass memory cells program inhibition; that is, based on the first verification information, the second verification information and the third verification information, different bit line voltages are applied to the bit line coupled to the first memory cells, where the memory cells that pass the verification are inhibited from being programmed (the program inhibition bit line voltage is applied to the third bit line connected to the third group of memory cells). This operation is described in conjunction with the circuit in FIG. 17 as follows: Pass data in the DS is used to inhibit the data of D1/D2/D3/DC in the Pn state, that is, write it as 1. That is: D*='DS&P*.
9. Determining whether it is the last programmed state;
10. If not, the second verification information in DL is exchanged with the first verification information in DM. This operation is described in conjunction with the circuit in FIG. 17 as follows: exchanging data in DL/DM, and after the exchange, 3BL data is in DL, and 4BL data is in DM. After that, verification operation of the Pn+1 state is entered, which is similar to the above.
11. If yes, the verification is ended. Pn+1 is the last verify programmed state. Therefore, after it is ended, the verify recovery is directly entered and the verify sequence ends.

Implementations of the present application propose an operation method of a memory. By transmitting the initial verification information in the dynamic storage circuit to the sensing node, transmitting the first verification information from the first sensing circuit to the dynamic storage circuit, and performing a clearing operation on the first sensing circuit, the first sensing circuit can sense the first verification information and the second verification information at different times, so that the program verify operation of the 4BL (bit line) scheme of a memory cell of the memory can be completed by only one complete sensing at the same verify voltage. That is, in the page buffer structure based on the dynamic latch circuit, triple-strobe is used in the verification of 4BL programming. In other words, SO data is detected at three time points of a complete SO sensing discharge, and 3BL/4BL/Pass data (first verification information, second verification information and third verification information) are obtained respectively. The scheme can effectively reduce programming time and improve programming performance.

Based on the same inventive concept, the implementations of the present application further provide another operation method of a memory. This implementation is described from the perspective of timing to explain how the operation method provided in the present application enables the bit line to be precharged only once at the same verify voltage by the verify operation of the 4BL BIAS programming and then to be sensed at three different time points during the discharge to complete 3BL sensing, 4BL sensing and Pass sensing. It should be noted that the memory to which this operation method is applicable also includes a page buffer. The page buffer includes a first sensing circuit coupled to the sensing node and a dynamic storage circuit coupled to the first sensing circuit. The memory cell included in the memory is configured to store one of a plurality of programmed states.

Figure 19:
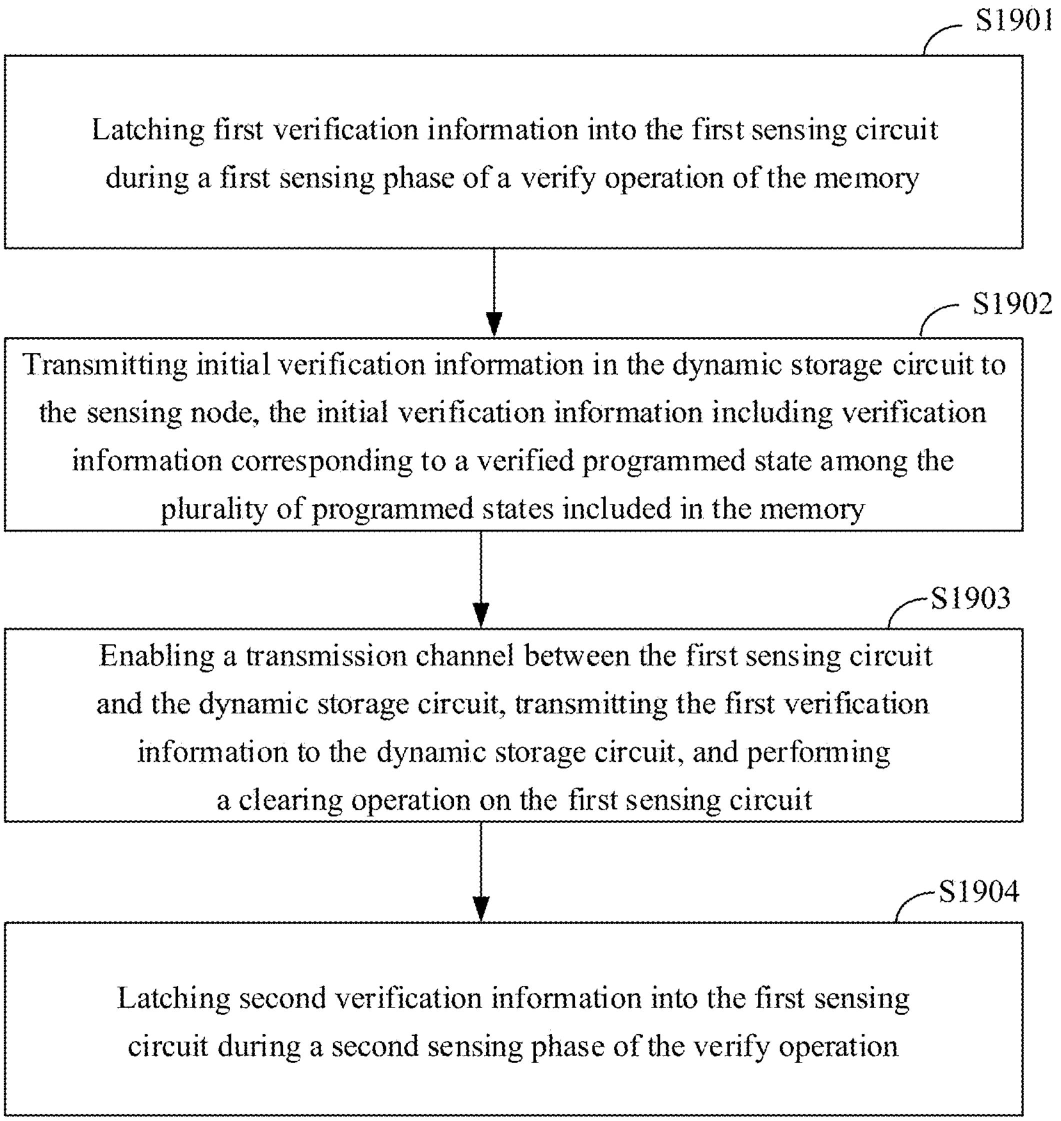
FIG. 19 is a schematic flowchart of an operation method for memory described from a timing perspective in accordance with some aspects of the present application.

In an example, as shown in FIG. 19, the operation method may include:

S1901: latching first verification information into the first sensing circuit during a first sensing stage of a verify operation of the memory;

S1902: transmitting initial verification information in the dynamic storage circuit to the sensing node, the initial verification information including verification information corresponding to a verified programmed state among the plurality of programmed states included in the memory;

S1903: enabling a transmission channel between the first sensing circuit and the dynamic storage circuit, transmitting the first verification information to the dynamic storage circuit, and performing a clearing operation on the first sensing circuit; and

S1904: latching second verification information into the first sensing circuit during a second sensing stage of the verify operation;

wherein the first potential of the sensing node corresponding to the first verification information is greater than the second potential of the sensing node corresponding to the second verification information.

In some implementations, the page buffer further includes a second sensing circuit coupled to the sensing node; and the operation method further includes:

latching third verification information into the second sensing circuit during a third sensing stage of the verify operation, wherein the second potential of the sensing node corresponding to the second verification information is greater than the third potential of the sensing node corresponding to the third verification information.

In some implementations, the page buffer further includes at least one data latch circuit; and the operation method further includes: before the first sensing stage of the verify operation of the memory, a precharging stage and a first discharging stage, wherein;

in the precharging stage, latching selected operation information into the second sensing circuit; precharging the sensing node to a preset initial voltage based on the selected operation information; and in the first discharge stage, discharging the sensing node from the preset initial voltage, and after a first preset duration, suspending discharging the sensing node;

wherein the selected operation information is obtained based on data information in the at least one data latch circuit and the initial verification information in the dynamic storage circuit, and is configured to select a first memory cell in a programmed state to be verified or a second memory cell in a verified programmed state that fails verification among the plurality of programmed states.

In some implementations, the latching the first verification information into the first sensing circuit includes:

after suspending discharging the sensing node, causing the first sensing circuit to latch the first verification information to the first sensing circuit in response to a first latch signal.

In some implementations, the operation method further includes: before the second sensing stage of the verify operation of the memory, a second discharging stage; wherein in the second discharging stage, the sensing node is discharged from the first potential, and discharging the sensing node is suspended after a second preset duration; and the operation method further includes: after the second sensing stage of the verify operation of the memory, a third discharging stage; wherein in the third discharging stage, the sensing node is discharged from the second potential, and discharging the sensing node is suspended after a third preset duration.

In some implementations, the operation method further includes:

after the second discharging stage, causing the first sensing circuit to latch the second verification information into the first sensing circuit in response to a second latch signal; and after the third discharging stage, causing the second sensing circuit to latch the third verification information into the second sensing circuit in response to a third latch signal.

In some implementations, the operation method further includes: after the third sensing stage of the verify operation:

applying different bit line voltages to bit lines coupled to the first memory cell in the programmed state to be verified among the plurality of programmed states based on the first verification information, the second verification information and the third verification information;

wherein a first bit line voltage is applied to a first bit line connected to a first forced cell; a second bit line voltage is applied to a second bit line connected to a second forced cell; a program inhibition bit line voltage is applied to a third bit line connected to a third group of memory cells; the first forced cell is a memory cell among the first group of memory cells except a second group of memory cells and the third group of memory cells; and the second forced cell is a memory cell among the second group of memory cells except the third group of memory cells.

In some implementations, the first group of memory cells includes the memory cells among the first memory cells that have passed verification with a first verify voltage;

the second group of memory cells includes memory cells among the first memory cells that have passed verification with a second verify voltage; and the third group of memory cells includes memory cells among the first memory cells that have passed verification with a third verify voltage; and wherein, if the first potential is greater than or equal to a first preset voltage, the first verification information is configured to indicate a first group of memory cells that have passed verification with a first verify voltage among the first memory cell and the second memory cell;

if the second potential is greater than or equal to a second preset voltage, the second verification information is configured to indicate a second group of memory cells that have passed verification with a second verify voltage among the first memory cell and the second memory cell; and if the third potential is greater than or equal to a third preset voltage, the third verification information is configured to indicate a third group of memory cells that have passed verification with a third verify voltage among the first memory cell and the second memory cell; and the first verify voltage is less than the second verify voltage, and the second verify voltage is less than the third verify voltage.

In some implementations, the operation method further includes: after the third sensing stage of the verify operation:

after applying different bit line voltages to the bit line coupled to the first memory cell, determining whether the programmed state to be verified is a last programmed state among the plurality of programmed states; and if it is determined that the programmed state to be verified is not the last programmed state, performing an exchange operation on the first sensing circuit and the dynamic storage circuit such that the second verification information is stored in the dynamic storage circuit, and the first verification information is stored in the first sensing circuit.

In some implementations, the programming of the memory includes at least one round of programming loop; the programming loop includes: a program operation and a verify operation; and the operation method further includes: before the verify operation, performing a clearing operation on the first sensing circuit and the dynamic storage circuit.

In some implementations, the page buffer further includes a first transistor and a second transistor connected in series; wherein a terminal of the first transistor is connected to a positive terminal of a power supply, and a terminal of the second transistor is connected to the sensing node; and the transmitting the initial verification information in the dynamic storage circuit to the sensing node includes:

making the second transistor controlled by a first transmission signal; and making the first transistor controlled by the initial verification information; and turning on the first transistor and the second transistor under the action of the first transmission signal and the initial verification information, and charging the sensing node corresponding to a third memory cell in the verified programmed state that passes verification among the plurality of programmed states, so as to transmit the initial verification information to the sensing node.

It should be noted that the operation method for the memory described above from the perspective of timing is the same in concept as the operation method for the memory described above, and the implementation of the technical features and the explanation of words appearing therein have been clearly described above, and will not be repeated herein.

Figure 20:
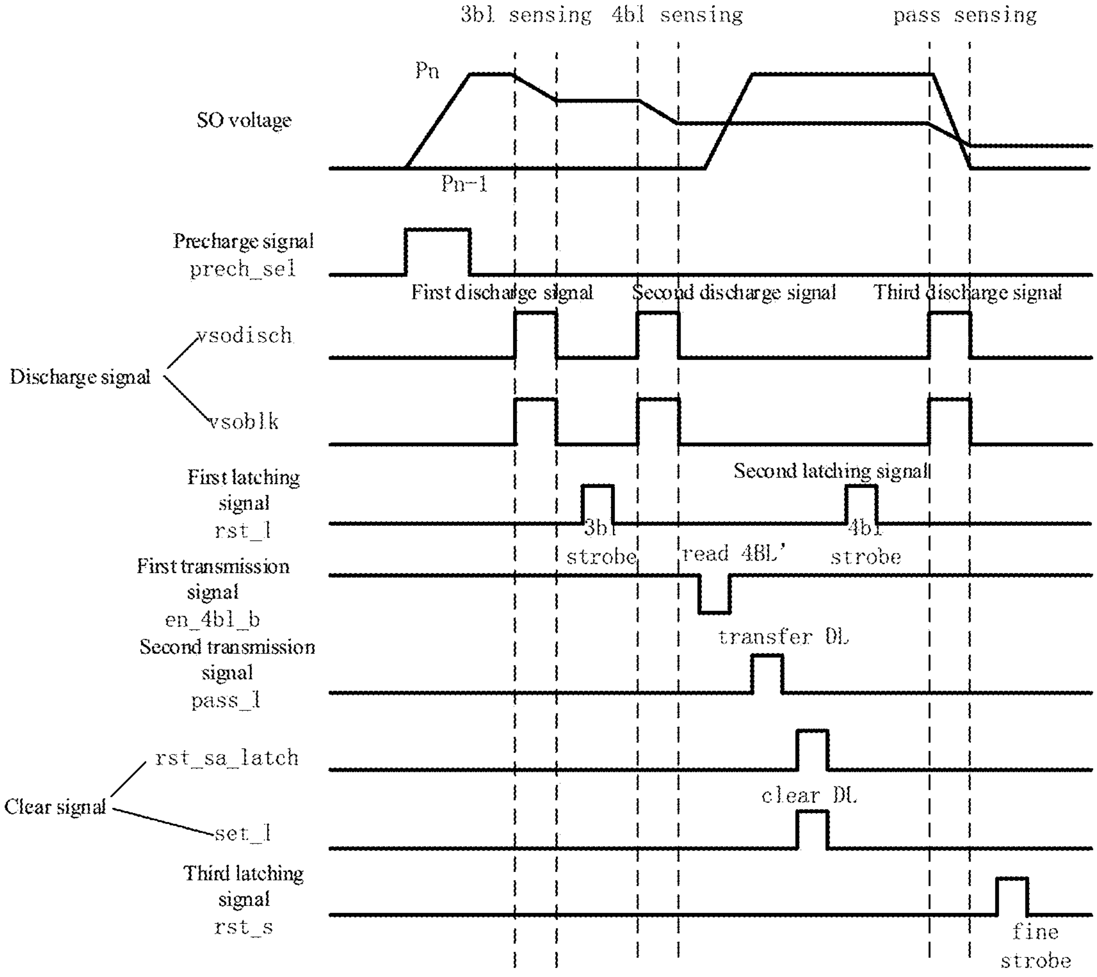
FIG. 20 is a timing diagram of the operation method described in FIG. 19 in accordance with some aspects of the present application.

To understand the above-mentioned operation method described from the perspective of timing, as shown in FIG. 20, it shows that implementing the verify operation of the 4BL BIAS programming method by using the operation method provided by the implementation of the present application enables the bit line to be precharged once at the same verify voltage, and then sensing is done at three different time points during the discharge to complete 3BL sensing, 4BL sensing and Pass sensing.

As shown in FIG. 20, the verify operation of the aforementioned 4BL BIAS programming scheme includes three stages: 3BL sensing, 4BL sensing, and Pass sensing. Therefore, the operation method described from the perspective of timing is also set forth around these three stages. The first sensing stage is the 3BL sensing, the second sensing node is the 4BL sensing, and the third sensing stage is the Pass sensing.

Therefore, according to the order of time sequence, the specific flow of the operation method can be as follows: before the first sensing stage, first performing the precharging stage and the first discharging stage; in an example, in the precharging stage, precharging the corresponding SO to the preset initial voltage in response to the control of the precharge signal prech_sel; in the first discharging stage, discharging the SO from the preset initial voltage for a period of time (for example, the first preset duration) in response to the discharge signals vsoblk and vsodosch, and suspending discharging of the SO; after that, entering the first sensing stage; at this stage, latching the first verification information into the first sensing circuit (3bl strobe) in response to the control of the first latch signal rst_1; after that, continuing the discharging of the SO for a period of time (for example, the second preset time), and suspending discharging of the SO; after that, reading the initial verification information to the corresponding SO in response to the first transmission signal en_4bl_b; transmitting the first verification information to the dynamic storage circuit in response to the second transmission signal pass_1, and clearing the first verification information in the first sensing circuit in response to the clear signal rst_sa_latch and set_1; after that, entering the second sensing stage, in this stage, latching the second verification information into the first sensing circuit (4bl strobe) in response to the second latch signal rst_l' (generated timing is different from the first latch signal); after that, discharging the SO for a period of time (for example, the third preset time), and suspending discharging of the SO; after that, entering the third sensing stage, in this stage, latching the third verification information into the second sensing circuit (fine strobe) in response to the third latch signal rst_s. It follows that, in the case of precharging the SO once, 3BL sensing, 4BL sensing and Pass sensing included in the verify operation of the 4BL BIAS programming scheme are completed by the sensings at three different time points.

Figure 21:
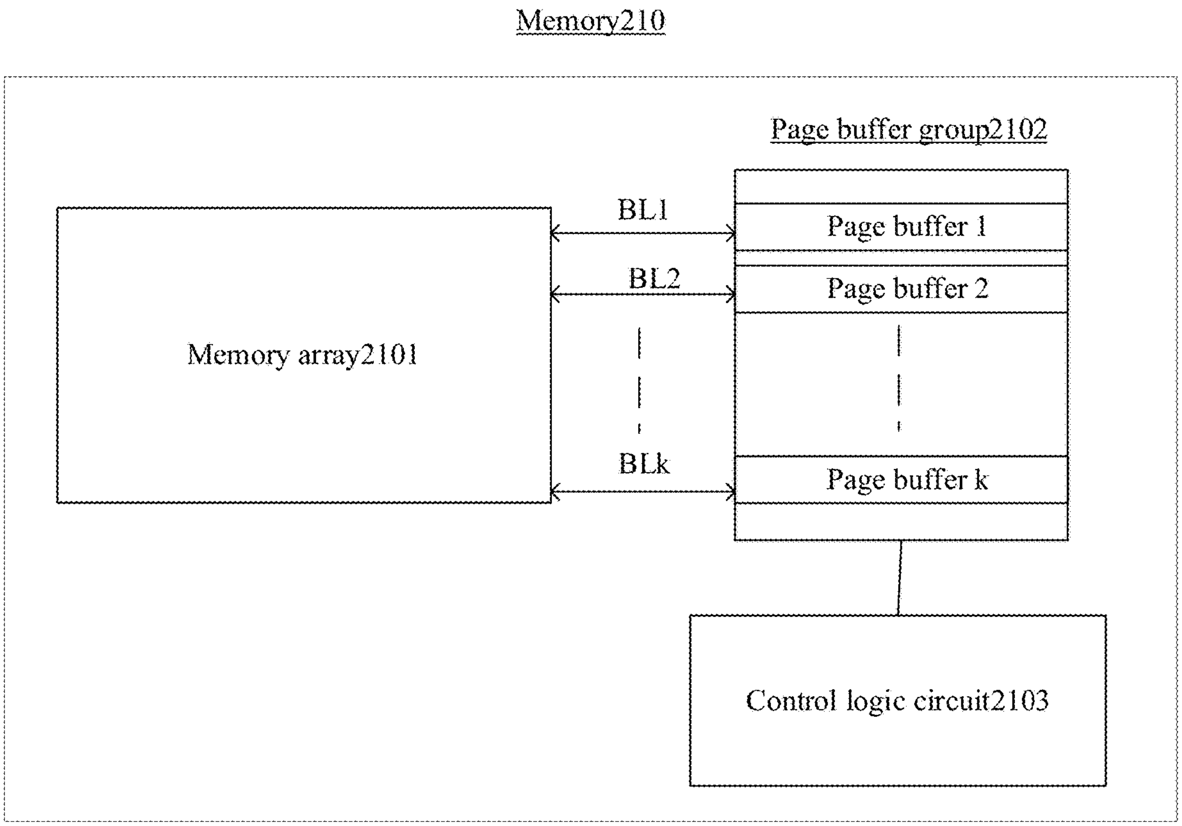
FIG. 21 is a schematic structural diagram of a memory in accordance with some aspects of the present application.

Based on the same inventive concept, as shown in FIG. 21, implementations of the present application provide a memory 210, including:

a memory array 2101, memory cells included in the memory array being configured to store one of a plurality of programmed states;

a page buffer group 2102 coupled to the memory array, the page buffer group 2102 including a plurality of page buffers, each page buffer including a first sensing circuit coupled to a sensing node and a dynamic storage circuit coupled to the first sensing circuit; and a control logic circuit 2103 coupled to the memory array and the plurality of page buffers; wherein, the control logic circuit is configured to: store first verification information into the first sensing circuit based on a first potential of the sensing node; transmit initial verification information in the dynamic storage circuit to the sensing node, the initial verification information including verification information corresponding to a verified programmed state among the plurality of programmed states; transmit the first verification information from the first sensing circuit to the dynamic storage circuit, and performing a clearing operation on the first sensing circuit; and store second verification information or the initial verification information into the first sensing circuit based on a second potential of the sensing node; wherein the first potential of the sensing node corresponding to the first verification information is greater than the second potential of the sensing node corresponding to the second verification information.

In some implementations, the page buffer further includes: a second sensing circuit coupled to the sensing node;

the control logic circuit is further configured to: store third verification information into the second sensing circuit based on a third potential of the sensing node; wherein the second potential of the sensing node corresponding to the second verification information is greater than the third potential of the sensing node corresponding to the third verification information.

In some implementations, the page buffer further includes at least one data latch circuit; the control logic circuit is further configured to: obtain selected operation information based on data information in the at least one data latch circuit and the initial verification information in the dynamic storage circuit, the selected operation information being configured to select the first memory cell in the programmed state to be verified or the second memory cell in the verified programmed state that fails verification among the plurality of programmed states; store the selected operation information into the second sensing circuit; and precharge the sensing nodes corresponding to the first memory cell and the second memory cell to a preset initial voltage based on the selected operation information.

In some implementations, the page buffer further includes a first transistor and a second transistor connected in series; and wherein another terminal of the first transistor is connected to a positive terminal of a power supply; another terminal of the second transistor is connected to the sensing node; the first transistor is controlled by the initial verification information; the second transistor is controlled by a first transmission signal; the first transistor and the second transistor are turned on under the action of the first transmission signal and the initial verification information, and the sensing node corresponding to a third memory cell in the verified programmed state that passes verification among the plurality of programmed states is charged, so as to transmit the initial verification information to the sensing node.

In some implementations, the page buffer further includes: a transmission switch; the transmission switch is configured to: transmit the first verification information from the first sensing circuit to the dynamic storage circuit in response to a second transmission signal sent by the control logic circuit.

In some implementations, the page buffer further includes a precharge circuit; the control logic circuit is further configured to: obtain the selected operation information based on the data information in the at least one data latch circuit and the initial verification information stored in the dynamic storage circuit, latch the selected operation information into the second sensing circuit, and generate a precharge signal; and the precharge circuit is configured to: in response to the precharge signal, precharge the sensing nodes corresponding to the first memory cell and the second memory cell to the preset initial voltage based on the selected operation information.

In some implementations, the page buffer further includes: a discharge circuit;

the control logic circuit is further configured to: generate a first discharge signal, a second discharge signal, and a third discharge signal; and the discharge circuit is configured to: in response to the first discharge signal, discharge the sensing node from the preset initial voltage, and suspend discharging the sensing node after a first preset duration;

in response to the second discharge signal, discharge the sensing node from the first potential, and suspend discharging the sensing node after a second preset duration; and in response to the third discharge signal, discharge the sensing node from the second potential, and suspend discharging the sensing node after a third preset duration.

Here, the first discharge signal, the second discharge signal, and the third discharge signal are respectively configured to correspond to discharging of the first discharge stage SO, discharging of the second discharge stage SO, and discharging of the third discharge stage SO.

In some implementations, the first sensing circuit includes a first latch for storing the first verification information; the second sensing circuit includes a second latch for storing the third verification information; and the dynamic storage circuit includes a dynamic latch for storing the second verification information.

In some implementations, the control logic circuit is further configured to: after applying different bit line voltages to bit lines coupled to the first memory cell based on the first verification information, the second verification information, and the third verification information, determine whether the programmed state to be verified is a last programmed state among the plurality of programmed states; if it is determined that the programmed state to be verified is not the last programmed state, control the first sensing circuit and the dynamic storage circuit to perform an exchange operation such that the second verification information is stored in the dynamic storage circuit, and the first verification information is stored in the first sensing circuit.

In some implementations, after the first verification information is transmitted from the first sensing circuit to the dynamic storage circuit, the first sensing circuit is further configured to: reset the first sensing circuit in response to a clear signal sent by the control logic circuit, so as to restore the first sensing circuit into an initial state.

It should be noted that the memory provided by the implementations of the present application is the hardware structure implemented by the operation method provided by the above-mentioned implementations of the present application. The operations provided by the implementations of the present application involved herein have been described in detail above. Therefore, the terms appearing in the operations in the memory described herein can be understood by referring to the above descriptions of the operation method, and will not be repeated here.

Based on the same inventive concept, an implementation of the present application further provides a memory system, including: one or more aforementioned memories and a memory controller coupled to the memories and configured to control the memories.

An implementation of the present application further provides an electronic system, including: the aforementioned memory system and a host coupled to the memory system.

It should be noted that the memory system and the electronic system provided by the implementations of the present application include the aforementioned memory, both of which have the same technical features, and the structure of the memory and the terms appearing in the technical solution related to the present application have been elaborated in detail above. Thus, the terms appearing herein can be understood according to the meaning of the foregoing description, and will not be repeated here.

The above description is intended to be illustrative, not restrictive. For example, the above examples (or one or more aspects thereof) may be used in combination with each other. Other implementations as would be apparent to one of ordinary skill in the art upon reading the above description may be used. It should be understood that they will not be used to interpret or limit the scope or meaning of the claims. Furthermore, in the foregoing detailed description, various features may be grouped together to simplify the application. This should not be interpreted as implying that an unclaimed disclosed feature is essential to any claim. Rather, disclosed subject matter may lie in less than all features of a particular disclosed implementation. Thus, the following claims are hereby incorporated into the detailed description, with each claim standing on its own as a separate implementation, and it is contemplated that these implementations may be combined with each other in various combinations or permutations. The scope of the application should be determined with reference to the appended claims, along with the full scope of equivalents to which such claims are entitled.

What is claimed is:

1. An operation method of a memory, wherein the memory comprises:

a page buffer, comprising:

a first sensing circuit coupled to a sensing node; and a dynamic storage circuit coupled to the first sensing circuit; and a memory cell, configured to store one of a plurality of programmed states; and wherein the operation method comprises:

storing first verification information into the first sensing circuit based on a first potential of the sensing node;

transmitting initial verification information in the dynamic storage circuit to the sensing node, the initial verification information comprising verification information corresponding to a verified programmed state among the plurality of programmed states;

transmitting the first verification information from the first sensing circuit to the dynamic storage circuit;

performing a clearing operation on the first sensing circuit; and storing second verification information or the initial verification information into the first sensing circuit based on a second potential of the sensing node, wherein the first potential of the sensing node corresponding to the first verification information is greater than the second potential of the sensing node corresponding to the second verification information, wherein programming of the memory comprises at least one round of programming loop; the programming loop comprises: a program operation and a verify operation; and the operation method further comprises:

before the verify operation, performing a clearing operation on the first sensing circuit and the dynamic storage circuit.

2. The operation method of claim 1, wherein the page buffer further comprises a second sensing circuit coupled to the sensing node; and the operation method further comprises:

storing third verification information into the second sensing circuit based on a third potential of the sensing node;

wherein the second potential of the sensing node corresponding to the second verification information is greater than the third potential of the sensing node corresponding to the third verification information.

3. The operation method of claim 2, wherein the page buffer further comprises at least one data latch circuit; and before storing first verification information into the first sensing circuit based on a first potential of the sensing node, the operation method further comprises:

obtaining selected operation information based on data information in the at least one data latch circuit and the initial verification information in the dynamic storage circuit, the selected operation information being configured to select a first memory cell in a programmed state to be verified or a second memory cell in a verified programmed state that fails verification among the plurality of programmed states;

storing the selected operation information into the second sensing circuit; and precharging the sensing nodes corresponding to the first memory cell and the second memory cell to a preset initial voltage based on the selected operation information.

4. The operation method of claim 3, further comprising:

discharging the sensing node from the preset initial voltage, suspending discharging the sensing node after a first preset duration, sensing the first potential of the sensing node, and storing the first verification information into the first sensing circuit;

discharging the sensing node from the first potential, suspending discharging the sensing node after a second preset duration, sensing the second potential of the sensing node after the first sensing circuit is cleared, and storing the second verification information into the first sensing circuit; and discharging the sensing node from the second potential, suspending discharging the sensing node after a third preset duration, sensing the third potential of the sensing node, and storing the third verification information into the second sensing circuit.

5. The operation method of claim 4, further comprising:

if the first potential is greater than or equal to a first preset voltage, the first verification information to indicate a first group of memory cells that have passed verification with a first verify voltage among the first memory cell and the second memory cell;

if the second potential is greater than or equal to a second preset voltage, the second verification information to indicate a second group of memory cells that have passed verification with a second verify voltage among the first memory cell and the second memory cell; and if the third potential is greater than or equal to a third preset voltage, the third verification information to indicate a third group of memory cells that have passed verification with a third verify voltage among the first memory cell and the second memory cell, wherein the first verify voltage is less than the second verify voltage and the second verify voltage is less than the third verify voltage.

6. The operation method of claim 5, further comprising:

applying different bit line voltages to bit lines coupled to the first memory cell based on the first verification information, the second verification information, and the third verification information;

wherein a first bit line voltage is applied to a first bit line connected to a first forced cell; a second bit line voltage is applied to a second bit line connected to a second forced cell; a program inhibition bit line voltage is applied to a third bit line connected to a third group of memory cells; the first forced cell is a memory cell in the first group of memory cells except the second group of memory cells and the third group of memory cells; and the second forced cell is a memory cell in the second group of memory cells except for the third group of memory cells.

7. The operation method of claim 6, further comprising:

after applying different bit line voltages to bit lines coupled to the first memory cell, determining whether the programmed state to be verified is a last programmed state among the plurality of programmed states; and in response to determining that the programmed state to be verified is not the last programmed state, performing an exchange operation on the first sensing circuit and the dynamic storage circuit, such that the second verification information is stored in the dynamic storage circuit, and the first verification information is stored in the first sensing circuit.

8. The operation method of claim 1, wherein the dynamic storage circuit corresponding to a first memory cell in a programmed state to be verified or a second memory cell in a verified programmed state that fails verification among the plurality of programmed states is in an initial state.

9. The operation method of claim 8, wherein the transmitting the initial verification information in the dynamic storage circuit to the sensing node comprises:

charging the sensing node corresponding to a third memory unit in the verified programmed state that passes verification among the plurality of programmed states based on the initial verification information, to transmit the initial verification information to the sensing node.

10. The operation method of claim 1, wherein the transmitting the first verification information from the first sensing circuit to the dynamic storage circuit comprises:

enabling a transmission channel between the first sensing circuit and the dynamic storage circuit, such that the first verification information in the first sensing circuit is transmitted to the dynamic storage circuit.

11. The operation method of claim 1, wherein the performing a clearing operation on the first sensing circuit comprises:

resetting the first sensing circuit to restore the first sensing circuit into an initial state.

12. An operation method of a memory, wherein the memory comprises:

a page buffer, comprising:

a first sensing circuit coupled to a sensing node; and a dynamic storage circuit coupled to the first sensing circuit; and a memory cell, configured to store one of a plurality of programmed states; and wherein the operation method comprises:

latching first verification information into the first sensing circuit during a first sensing stage of a verify operation of the memory;

transmitting initial verification information in the dynamic storage circuit to the sensing node, the initial verification information comprising verification information corresponding to a verified programmed state among the plurality of programmed states comprised in the memory;

enabling a transmission channel between the first sensing circuit and the dynamic storage circuit, transmitting the first verification information to the dynamic storage circuit;

performing a clearing operation on the first sensing circuit; and latching second verification information into the first sensing circuit during a second sensing stage of the verify operation, wherein a first potential of the sensing node corresponding to the first verification information is greater than a second potential of the sensing node corresponding to the second verification information, wherein programming of the memory comprises at least one round of programming loop; the programming loop comprises: a program operation and a verify operation; and the operation method further comprises:

before the verify operation, performing a clearing operation on the first sensing circuit and the dynamic storage circuit.

13. The operation method of claim 12, wherein the page buffer further comprises a second sensing circuit coupled to the sensing node; and the operation method further comprises:

latching third verification information into the second sensing circuit during a third sensing stage of the verify operation, wherein the second potential of the sensing node corresponding to the second verification information is greater than a third potential of the sensing node corresponding to the third verification information.

14. The operation method of claim 13, wherein the page buffer further comprises at least one data latch circuit; and before the first sensing stage of the verify operation of the memory, the operation method further comprises: a precharging stage and a first discharging stage, wherein:

during the precharging stage, latching selected operation information into the second sensing circuit; precharging the sensing node to a preset initial voltage based on the selected operation information; and during the first discharge stage, discharging the sensing node from the preset initial voltage, and after a first preset duration, suspending discharging the sensing node, wherein the selected operation information is obtained based on data information in the at least one data latch circuit and the initial verification information in the dynamic storage circuit, and configured to select a first memory cell in a programmed state to be verified or a second memory cell in a verified programmed state that fails verification among the plurality of programmed states.

15. The operation method of claim 14, wherein the latching the first verification information into the first sensing circuit comprises:

after suspending discharging the sensing node, causing the first sensing circuit to latch the first verification information to the first sensing circuit in response to a first latch signal.

16. The operation method of claim 15, wherein:

before the second sensing stage of the verify operation of the memory, the operation method further comprises: a second discharging stage; wherein during the second discharging stage, the sensing node is discharged from the first potential, and discharging the sensing node is suspended after a second preset duration; and after the second sensing stage of the verify operation of the memory, the operation method further comprises: a third discharging stage, wherein during the third discharging stage, the sensing node is discharged from the second potential, and discharging the sensing node is suspended after a third preset duration.

17. The operation method of claim 16, further comprising:

after the second discharging stage, causing the first sensing circuit to latch the second verification information into the first sensing circuit in response to a second latch signal; and after the third discharging stage, causing the second sensing circuit to latch the third verification information into the second sensing circuit in response to a third latch signal.

18. The operation method of claim 14, wherein after the third sensing stage of the verify operation, the operation method further comprises:

applying different bit line voltages to bit lines coupled to the first memory cell in the programmed state to be verified among the plurality of programmed states based on the first verification information, the second verification information and the third verification information, wherein a first bit line voltage is applied to a first bit line connected to a first forced cell; a second bit line voltage is applied to a second bit line connected to a second forced cell; a program inhibition bit line voltage is applied to a third bit line connected to a third group of memory cells; the first forced cell is a memory cell among a first group of memory cells except a second group of memory cells and the third group of memory cells; and the second forced cell is a memory cell among the second group of memory cells except the third group of memory cells.

19. A memory, comprising:

a memory array, comprising a memory cell configured to store one of a plurality of programmed states;

a plurality of page buffers coupled to the memory array, each page buffer comprising a first sensing circuit coupled to a sensing node and a dynamic storage circuit coupled to the first sensing circuit; and a control logic circuit coupled to the memory array and the plurality of page buffers; wherein the control logic circuit is configured to:

store first verification information into the first sensing circuit based on a first potential of the sensing node;

transmit initial verification information in the dynamic storage circuit to the sensing node, the initial verification information comprising verification information corresponding to a verified programmed state among the plurality of programmed states;

transmit the first verification information from the first sensing circuit to the dynamic storage circuit;

perform a clearing operation on the first sensing circuit; and store second verification information or the initial verification information into the first sensing circuit based on a second potential of the sensing node, wherein the first potential of the sensing node corresponding to the first verification information is greater than the second potential of the sensing node corresponding to the second verification information, wherein programming of the memory comprises at least one round of programming loop; the programming loop comprises: a program operation and a verify operation; and the control logic is configured to:

before the verify operation, perform a clearing operation on the first sensing circuit and the dynamic storage circuit.

20. The memory of claim 19, wherein the page buffer further comprises a second sensing circuit coupled to the sensing node; and the control logic is configured to:

storing third verification information into the second sensing circuit based on a third potential of the sensing node;

wherein the second potential of the sensing node corresponding to the second verification information is greater than the third potential of the sensing node corresponding to the third verification information.

21. The memory of claim 19, wherein the dynamic storage circuit corresponding to a first memory cell in a programmed state to be verified or a second memory cell in a verified programmed state that fails verification among the plurality of programmed states is in an initial state.

* * * * *